(12) United States Patent
Terasaki et al.

(10) Patent No.: US 9,648,737 B2
(45) Date of Patent: ***May 9, 2017

(54) BONDED BODY AND POWER MODULE SUBSTRATE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/913,845

(22) PCT Filed: Aug. 18, 2014

(86) PCT No.: PCT/JP2014/071524
§ 371 (c)(1),
(2) Date: Feb. 23, 2016

(87) PCT Pub. No.: WO2015/029811
PCT Pub. Date: Mar. 5, 2015

(65) Prior Publication Data
US 2016/0249452 A1 Aug. 25, 2016

(30) Foreign Application Priority Data
Aug. 26, 2013 (JP) .................................. 2013-175002

(51) Int. Cl.
*H05K 1/09* (2006.01)
*B23K 35/30* (2006.01)
(Continued)

(52) U.S. Cl.
CPC ............. *H05K 1/09* (2013.01); *B23K 35/025* (2013.01); *B23K 35/0222* (2013.01);
(Continued)

(58) Field of Classification Search
CPC ............. B23K 35/025; B23K 35/0222; B23K 35/0255; B23K 35/0233; B23K 35/302;
(Continued)

(56) References Cited

U.S. PATENT DOCUMENTS 4,460,658 A    7/1984   Bose et al.
4,729,504 A    3/1988   Edamura
(Continued)

FOREIGN PATENT DOCUMENTS

DE       3618102 A1    2/1987
JP       58-100995 A    6/1983
(Continued)

OTHER PUBLICATIONS

International Search Report mailed Nov. 18, 2014, issued for PCT/JP2014/071524 and English translation thereof.
(Continued)

*Primary Examiner* — Hoa C Nguyen
(74) *Attorney, Agent, or Firm* — Locke Lord LLP

(57) ABSTRACT

The bonded body of the present invention includes: a ceramic member made of ceramics; and a Cu member which is made of Cu or a Cu alloy and bonded to the ceramic member through a Cu—P—Sn-based brazing filler material and a Ti material, wherein a Cu—Sn layer, in which Sn forms a solid solution with Cu, is formed at a bonded interface between the ceramic member and the Cu member, and intermetallic compounds containing P and Ti are dispersed in the Cu—Sn layer.

5 Claims, 12 Drawing Sheets

(51) Int. Cl.
  C04B 37/02    (2006.01)
  C22C 9/02     (2006.01)
  H01L 23/15    (2006.01)
  H01L 23/373   (2006.01)
  H01L 21/48    (2006.01)
  B23K 35/02    (2006.01)
  C22C 9/00     (2006.01)
  C22C 14/00    (2006.01)
  B23K 35/32    (2006.01)
  H05K 1/03     (2006.01)
  H01L 23/473   (2006.01)

(52) U.S. Cl.
  CPC ...... *B23K 35/0233* (2013.01); *B23K 35/0244* (2013.01); *B23K 35/30* (2013.01); *B23K 35/302* (2013.01); *B23K 35/3026* (2013.01); *B23K 35/325* (2013.01); *C04B 37/02* (2013.01); *C22C 9/00* (2013.01); *C22C 9/02* (2013.01); *C22C 14/00* (2013.01); *H01L 21/4882* (2013.01); *H01L 23/15* (2013.01); *H01L 23/3735* (2013.01); *H05K 1/0306* (2013.01); *C04B 2237/124* (2013.01); *C04B 2237/366* (2013.01); *C04B 2237/407* (2013.01); *H01L 23/473* (2013.01); *H01L 2224/32225* (2013.01); *H01L 2924/0002* (2013.01)

(58) Field of Classification Search
  CPC .............. B23K 35/325; B23K 35/3066; B23K 35/3086; H05K 1/09; H05K 1/0306; C22C 9/00; C22C 9/06; C22C 33/0214; H01L 23/15; H01L 23/3735; H01L 21/4882; C04B 2237/124; C04B 2237/366
  See application file for complete search history.

(56) References Cited

U.S. PATENT DOCUMENTS

| | | | |
|---|---|---|---|
| 5,378,294 A | 1/1995 | Rissanen | |
| 5,561,321 A * | 10/1996 | Hirano | B32B 15/01 257/700 |
| 6,232,657 B1 | 5/2001 | Komorita et al. | |
| 6,261,703 B1 | 7/2001 | Sasaki et al. | |
| 6,457,233 B1 * | 10/2002 | Shimizu | B23K 35/001 228/180.1 |
| 6,773,535 B1 * | 8/2004 | Wetzel | B29C 65/76 156/247 |
| 6,967,065 B1 * | 11/2005 | Saitou | C23C 28/023 429/247 |
| 2004/0262367 A1 * | 12/2004 | Nakamura | H01L 23/3735 228/122.1 |
| 2005/0029666 A1 * | 2/2005 | Kurihara | H05K 3/3442 257/772 |
| 2005/0249629 A1 * | 11/2005 | Harris | B23K 35/302 420/472 |
| 2006/0244125 A1 | 11/2006 | Shiomi et al. | |
| 2009/0104572 A1 * | 4/2009 | Gao | B41M 5/38207 430/348 |
| 2009/0130480 A1 * | 5/2009 | Hatano | C22C 9/00 428/647 |
| 2009/0283309 A1 | 11/2009 | Naba et al. | |
| 2010/0247955 A1 | 9/2010 | Takahashi et al. | |
| 2012/0154974 A1 * | 6/2012 | Bhatnagar | H01L 21/67017 361/234 |
| 2013/0270001 A1 * | 10/2013 | Nakano | B23K 35/0244 174/84 R |
| 2015/0217410 A1 * | 8/2015 | Fujimaki | B23K 35/262 403/272 |
| 2015/0273401 A1 * | 10/2015 | Miller | B01D 67/0037 210/500.25 |

FOREIGN PATENT DOCUMENTS

| | | |
|---|---|---|
| JP | 04-295065 A | 10/1992 |
| JP | 09-070686 A | 3/1997 |
| JP | 10-102167 A | 4/1998 |
| JP | 10-286666 A | 10/1998 |
| JP | 2001-085571 A | 3/2001 |
| JP | 2008-221290 A | 9/2008 |
| JP | 4350753 B2 | 10/2009 |
| JP | 4375730 B2 | 12/2009 |
| JP | 2011-108999 A | 6/2011 |
| JP | 2013-098387 A | 5/2013 |
| WO | 2004/018147 A1 | 3/2004 |
| WO | 2013/024813 A1 | 2/2013 |

OTHER PUBLICATIONS

International Search Report mailed Nov. 18, 2014, issued for PCT/JP2014/071523 and English translation thereof.
Notice of Allowance mailed Dec. 20, 2016, issued for the Japanese patent application No. 2013-175000 and English translation thereof.
Search Report dated Feb. 24, 2017, issued for the European Patent Application No. 14841139.0.
Search Report dated Mar. 8, 2017, issued for the European Patent Application No. 14839112.1.

* cited by examiner

BONDED BODY AND POWER MODULE SUBSTRATE

TECHNICAL FIELD

The invention relates to a bonded body in which a ceramic member is bonded to a Cu member, and a power module substrate in which a circuit layer is formed on one surface of a ceramic substrate.

Priority is claimed on Japanese Patent Application No. 2013-175002, filed Aug. 26, 2013, the contents of which are incorporated herein by reference.

BACKGROUND ART

Semiconductor devices such as an LED and a power module have a structure in which semiconductor elements are bonded to an upper surface of a circuit layer made of a conductive material.

A high-power control power semiconductor element used to control wind power generation systems and electric vehicles such as electric automobiles radiates a large amount of heat. For this reason, in the related art, a power module substrate, in which a metal plate with superior electrical conductivity as a circuit layer is bonded to one surface of a ceramic substrate made of aluminum nitride (AlN) or the like, is widely used as a substrate on which such power semiconductor elements are mounted. In another type of power module substrate, a metal plate as a metal layer may be bonded to the other surface of the ceramic substrate.

A power module substrate disclosed in PTL 1 has a structure in which a circuit layer is formed by bonding a Cu foil (Cu member) to one surface of a ceramic substrate (ceramic member). The power module substrate is formed by bonding the Cu foil to the ceramic substrate through the heating of the Cu foil which is disposed on the one surface of the ceramic substrate with a Cu—Mg—Ti brazing filler material interposed between the Cu foil and the ceramic substrate.

CITATION LIST

Patent Literature

[PTL 1] Japanese Patent No. 4375730

SUMMARY OF INVENTION

Technical Problem

As disclosed in PTL 1, when the ceramic substrate and the Cu foil are bonded to each other through the Cu—Mg—Ti brazing filler material to form a circuit layer, a thick intermetallic compound layer containing Cu, Mg, or Ti is formed at a bonded interface between the ceramic substrate and the brazing filler material.

Since the intermetallic compound layer formed at the bonded interface between the ceramic substrate and the brazing filler material is rigid, when the power module substrate undergoes a thermal cycle, thermal stress generating in the ceramic substrate is increased, and cracking is likely to occur in the ceramic substrate, which is a problem.

In addition, if the rigid intermetallic compound layer is formed with large thickness at the bonded interface between the ceramic substrate and the brazing filler material when the Cu foil is bonded to the ceramic substrate through the brazing filler material, the bonding rate between the ceramic substrate and the circuit layer is decreased, and sufficient bonding therebetween cannot be obtained, which is a problem.

The present invention is made in light of these problems, and an object of the invention is to provide a bonded body and a power module substrate in which a ceramic member and a Cu member can be sufficiently bonded to each other, and when the bonded body and the power module substrate undergo a thermal cycle, the occurrence of cracking in the ceramic member can be limited.

Solution to Problem

According to a first aspect of the present invention, in order to solve these problems, there is provided a bonded body including: a ceramic member made of ceramics; and a Cu member which is made of Cu or a Cu alloy and bonded to the ceramic member through a Cu—P—Sn-based brazing filler material and a Ti material, in which a Cu—Sn layer, in which Sn forms a solid solution with Cu, is formed at a bonded interface between the ceramic member and the Cu member, and intermetallic compounds containing P and Ti are dispersed in the Cu—Sn layer.

In the bonded body according to the first aspect of the present invention, P contained in the Cu—P—Sn-based brazing filler material is drawn into the intermetallic compounds at the bonded interface between the ceramic member and the Cu member. Thereby, the Cu—Sn layer is formed, and the intermetallic compounds are dispersed in the Cu—Sn layer. That is, since a rigid intermetallic compound layer is not formed at the bonded interface between the ceramic member and the Cu—Sn layer, it is possible to reduce thermal stress generating in the ceramic member when the bonded body undergoes a thermal cycle. As a result, it is possible to limit the occurrence of cracking in the ceramic member.

Since a rigid intermetallic compound layer is not formed at the bonded interface between the ceramic member and the Cu—Sn layer, the bonding rate between the ceramic member and the Cu member is improved, and the ceramic member and the Cu member are sufficiently bonded to each other.

According to a second aspect of the present invention, there is provided a power module substrate including the above-mentioned bonded body, in which the substrate further includes: a ceramic substrate formed of the ceramic member; and a circuit layer formed by bonding a Cu foil formed of the Cu member to a first surface of the ceramic substrate through the Cu—P—Sn-based brazing filler material and the Ti material, and in which the Cu—Sn layer, in which Sn forms a solid solution with Cu, is formed at a bonded interface between the ceramic substrate and the circuit layer, and the intermetallic compounds containing P and Ti are dispersed in the Cu—Sn layer.

In the power module substrate according to the second aspect of the present invention, P contained in the Cu—P—Sn-based brazing filler material is drawn into the intermetallic compounds at the bonded interface between the ceramic substrate and the circuit layer. Thereby, the Cu—Sn layer is formed, and the intermetallic compounds are dispersed in the Cu—Sn layer. That is, since a rigid intermetallic compound layer is not formed at the bonded interface between the ceramic substrate and the Cu—Sn layer, it is possible to reduce thermal stress generating in the ceramic substrate when the power module substrate undergoes a thermal cycle. As a result, it is possible to limit the occurrence of cracking in the ceramic substrate. Since a rigid intermetallic compound layer is not formed at the bonded interface between the ceramic substrate and the Cu—Sn layer, the bonding rate between the ceramic substrate and the circuit layer is improved, and the ceramic substrate and the circuit layer are sufficiently bonded to each other.

In the power module substrate according to the second aspect of the present invention, a metal layer is preferably formed on a second surface of the ceramic substrate.

Since the metal layer is formed on the second surface of the ceramic substrate, the power module substrate is capable of efficiently dissipating heat from a ceramic substrate side through the metal layer.

It is preferable that the metal layer is formed by bonding a Cu foil made of Cu or a Cu alloy to the second surface of the ceramic substrate through a Cu—P—Sn-based brazing filler material and a Ti material, a Cu—Sn layer, in which Sn forms a solid solution with Cu, is formed at a bonded interface between the ceramic substrate and the metal layer, and intermetallic compounds containing P and Ti are dispersed in the Cu—Sn layer.

In this case, P contained in the Cu—P—Sn-based brazing filler material is drawn into the intermetallic compounds at the bonded interface between the ceramic substrate and the metal layer. Thereby, the Cu—Sn layer is formed, and the intermetallic compounds are dispersed in the Cu—Sn layer. That is, since a rigid intermetallic compound layer is not formed at the bonded interface between the ceramic substrate and the Cu—Sn layer, it is possible to reduce thermal stress generating in the ceramic substrate when the power module substrate undergoes a thermal cycle. As a result, it is possible to limit the occurrence of cracking in the ceramic substrate. Since a rigid intermetallic compound layer is not formed at the bonded interface between the ceramic substrate and the Cu—Sn layer, the bonding rate between the ceramic substrate and the metal layer is improved, and the ceramic substrate and the metal layer are sufficiently bonded to each other.

The metal layer may be made of Al or an Al alloy.

In this case, the metal layer made of Al or an Al alloy has low strength, and thus it is possible to reduce thermal stress generated in the ceramic substrate when the power module substrate undergoes a thermal cycle.

Advantageous Effects of Invention

According to the present invention, it is possible to provide the bonded body and the power module substrate in which the ceramic member and the Cu member can be sufficiently bonded to each other, and when the bonded body and the power module substrate undergo a thermal cycle, the occurrence of cracking in the ceramic member can be limited.

DESCRIPTION OF EMBODIMENTS

First Embodiment

Hereinafter, embodiments of the present invention will be described with reference to the accompanying drawings. First, a first embodiment of the present invention will be described.

Figure 1:
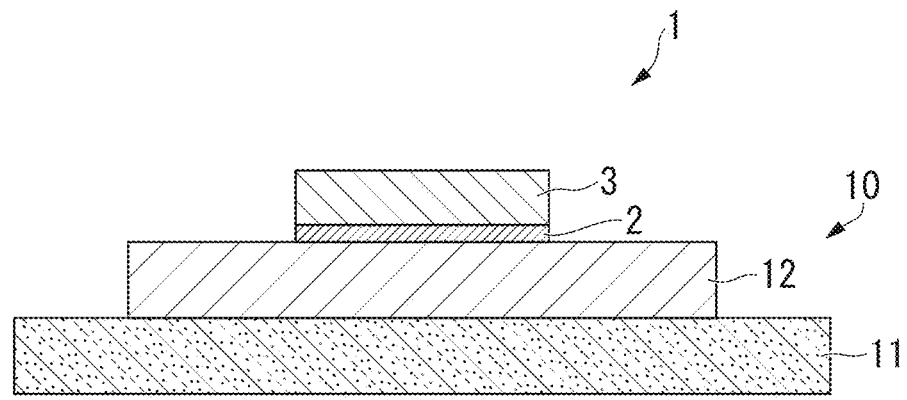
FIG. 1 is a schematic view of a power module in which a power module substrate is used in a first embodiment of the present invention.

A bonded body in the embodiment is a power module substrate 10 in which a ceramic substrate 11 formed of a ceramic member, and a Cu foil 22 (a circuit layer 12) formed of a Cu member, are bonded to each other. FIG. 1 shows a power module 1 including the power module substrate 10 in the embodiment.

The power module 1 includes the power module substrate 10 on which the circuit layer 12 is provided, and a semiconductor element 3 that is bonded to one surface (an upper surface in FIG. 1) of the circuit layer 12 through a bonding layer 2.

Figure 2:
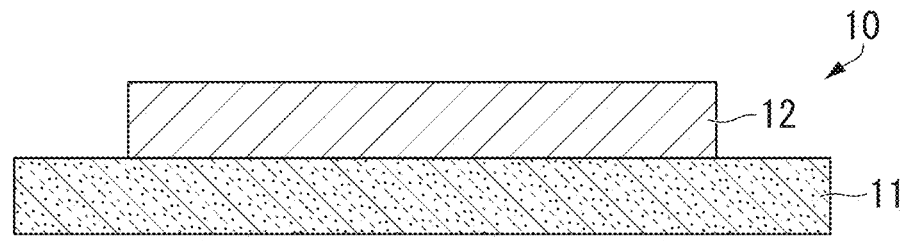
FIG. 2 is a schematic view of the power module substrate in the first embodiment of the present invention.

As shown in FIG. 2, the power module substrate 10 includes the ceramic substrate 11 including a first surface and a second surface, and the circuit layer 12 that is provided on the first surface (an upper surface in FIG. 2) which is one surface of the ceramic substrate 11.

The ceramic substrate 11 is made of high-insulation ceramics such as aluminum nitride (AlN), silicon nitride ($Si_3N_4$), and alumina ($Al_2O_3$). In the embodiment, the ceramic substrate 11 is made of aluminum nitride (AlN) having good heat radiation. The thickness of the ceramic substrate 11 is set to be in a range of 0.2 mm to 1.5 mm. In the embodiment, the thickness is set to 0.635 mm.

The circuit layer 12 is formed by bonding an electrically-conductive metal plate (the Cu foil 22) made of Cu or a Cu alloy to the first surface of the ceramic substrate 11 through a Cu—P—Sn-based brazing filler material. The Cu foil 22 may be made of oxygen-free copper, deoxidized copper, tough pitch copper, or the like. In the embodiment, the Cu foil 22 is made of oxygen-free copper. The thickness of the Cu foil 22 is set to be in a range of 0.1 mm to 1.0 mm. In the embodiment, the thickness is set to 0.6 mm.

Specific examples of the Cu—P—Sn-based brazing filler material include a Cu—P—Sn brazing filler material, a Cu—P—Sn—Ni-based brazing filler material, a Cu—P—Sn—Zn-based brazing filler material, a Cu—P—Sn—Mn-based brazing filler material, and a Cu—P—Sn—Cr-based brazing filler material. The Cu—P—Sn-based brazing filler material preferably contains 3 mass % to 10 mass % of P, and 0.5 mass % to 25 mass % of Sn. In the embodiment, a Cu—P—Sn—Ni brazing filler material 25 is used as the Cu—P—Sn-based brazing filler material. Preferably, the Cu—P—Sn-based brazing filler material is a foil material and the thickness thereof is in a range of 5 μm to 150 μm.

The Cu—P—Sn-based brazing filler material has a melting point of 710° C. or less. The Cu—P—Sn—Ni brazing filler material 25 used in the embodiment has a melting point of 580° C. In the embodiment, the solidus temperature of the Cu—P—Sn-based brazing filler material is used as the melting point thereof.

Figure 5:
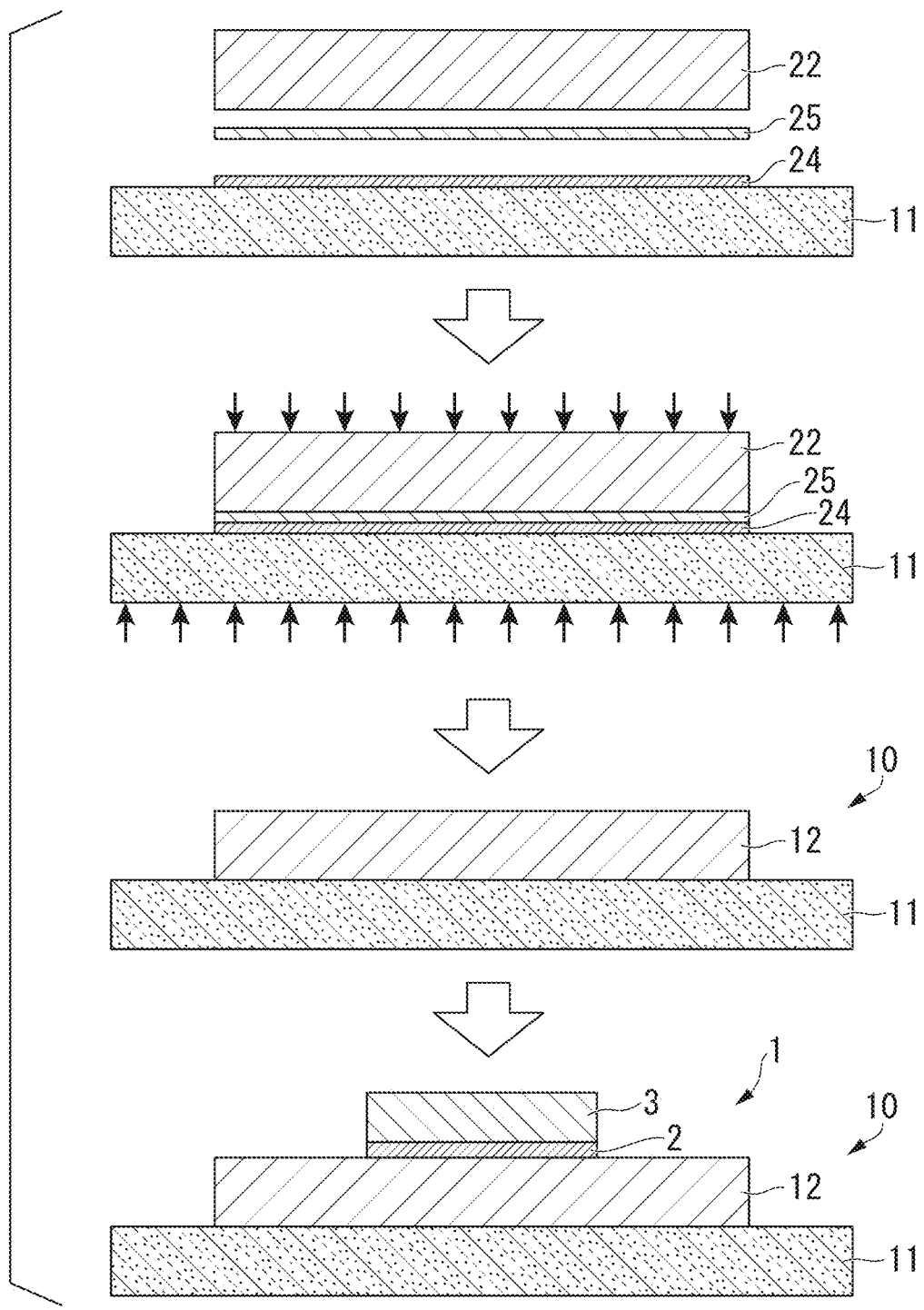
FIG. 5 shows schematic views showing the method of producing the power module substrate and the power module in the first embodiment of the present invention.

In the embodiment, the circuit layer 12 is formed by bonding the Cu foil 22 to the first surface of the ceramic substrate 11 through the heating of Ti paste 24 as a Ti material, the Cu—P—Sn—Ni brazing filler material 25, and the Cu foil 22 made of oxygen-free copper, which are sequentially laminated on the first surface of the ceramic substrate 11 (refer to FIG. 5). The Ti paste is a paste containing, for example, Ti powder, resin, and a solvent.

Ethyl cellulose, methyl cellulose, polymethyl methacrylate, acrylic resin, alkyd resin, and the like can be used as the resin.

Methyl cellosolve, ethyl cellosolve, terpineol, toluene, texanol, triethyl citrate, and the like can be used as the solvent. The purity of the Ti powder may be 99.4% or more. In the embodiment, the purity of the Ti powder is 99.6%.

The thickness of the circuit layer 12 is set to be in a range of 0.1 mm to 1.0 mm. In the embodiment, the thickness is set to 0.6 mm.

Figure 3:
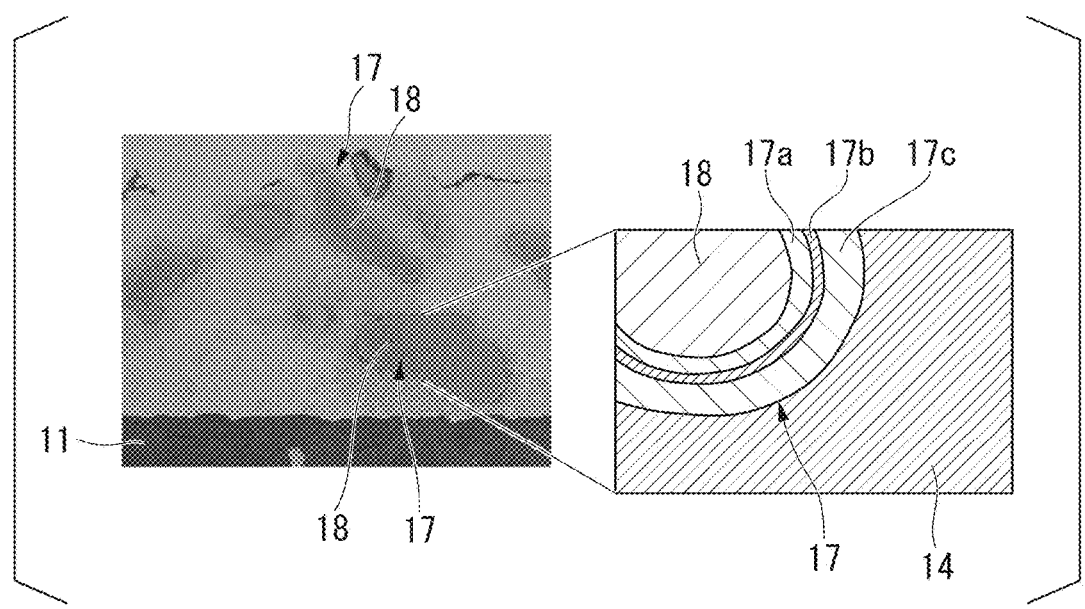
FIG. 3 is an electron micrograph obtained by capturing an image of the section of the bonded interface between a circuit layer and a ceramic substrate shown in FIG. 2, and a schematic view thereof.

FIG. 3 shows an electron micrograph of the bonded interface between the ceramic substrate 11 and the circuit layer 12, and a schematic view thereof. As shown in FIG. 3, a Cu—Sn layer 14 is formed at the bonded interface between the ceramic substrate 11 and the circuit layer 12. The intermetallic compounds 17 containing P, Ni, and Ti are dispersed in the Cu—Sn layer 14.

The Cu—Sn layer 14 is a layer in which Sn forms a solid solution with Cu. P and Ni contained in the Cu—P—Sn—Ni brazing filler material 25 are drawn into the intermetallic compounds 17, and thereby the Cu—Sn layer 14 is formed. The thickness of the Cu—Sn layer 14 may be set to be in a range of 1 μm to 140 μm.

P and Ni contained in the Cu—P—Sn—Ni brazing filler material 25 are combined with Ti in the Ti powder, and thereby the intermetallic compounds 17 are formed. In the embodiment, as shown in FIG. 3, each of the intermetallic compounds 17 include a Cu—Ni—Ti phase 17a, a P—Ti phase 17b, and a P—Ni—Ti phase 17c. The Cu—Ni—Ti phase 17a, the P—Ti phase 17b, and the P—Ni—Ti phase 17c are formed in the shape of an annular ring sequentially from the inside so as to surround a Ti particle 18 present in the Cu—Sn layer 14. That is, core-shell type inclusions are dispersed in the Cu—Sn layer 14, in each of which the Ti particle 18 is the core and the Cu—Ni—Ti phase 17a, the P—Ti phase 17b and the P—Ni—Ti phase 17c are formed sequentially from the inside as the shells. Only the annular ring-shaped intermetallic compound 17 without the Ti particle 18 may be formed. The Cu—Ni—Ti phase 17a, the P—Ti phase 17b, and the P—Ni—Ti phase 17c of the annular ring-shaped intermetallic compound 17 may be partially lost and discontinuous.

The semiconductor element 3 is made of a semiconductor material such as Si. The semiconductor element 3 and the circuit layer 12 are bonded to each other through the bonding layer 2.

The bonding layer 2 is made of a Sn—Ag-based solder material, a Sn—In-based solder material, a Sn—Ag—Cu-based solder material, or the like.

Figure 4:
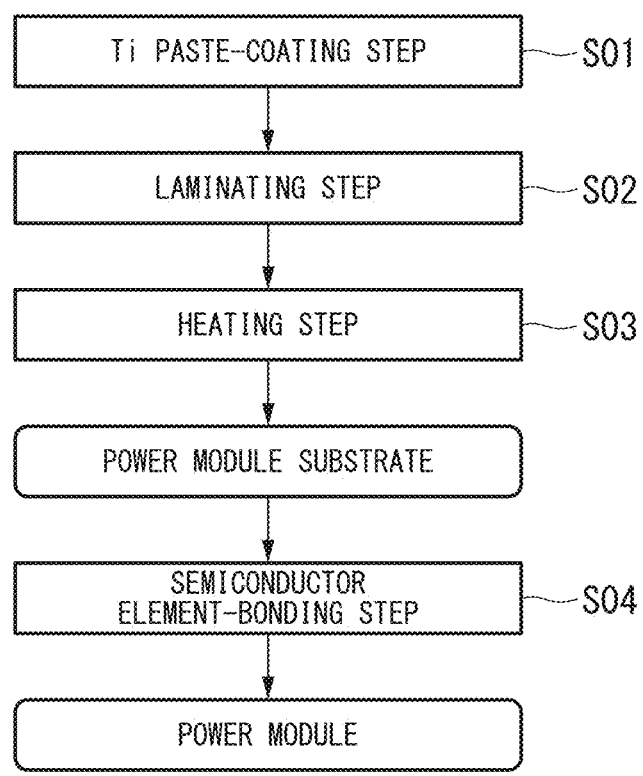
FIG. 4 is a flowchart showing a method of producing the power module substrate and the power module in the first embodiment of the present invention.

Hereinafter, a method of producing the power module substrate 10 and the power module 1 in the embodiment will be described with reference to the flowchart in FIG. 4, and FIG. 5.

First, as shown in FIG. 5, the Ti paste 24 is applied on the first surface (an upper surface in FIG. 5) which is one surface of the ceramic substrate 11 using screen-printing, and then dried (Ti-paste coating step S01). In the embodiment, a particle diameter of the Ti powder contained in the Ti paste 24 is 5 μm to 40 μm. An amount of the Ti powder in the Ti paste 24 is preferably set to be 40 mass % to 90 mass %.

The Ti paste 24 is preferably applied on the ceramics substrate 11 so that an amount of Ti is 1 $mg/cm^2$ to 20 $mg/cm^2$. The Ti paste 24 is more preferably applied so that an amount of Ti is 2 $mg/cm^2$ to 10 $mg/cm^2$.

It is preferable that the Ti paste 24 is dried at temperature of 120° C. to 150° C. for 10 minutes to 30 minutes.

Subsequently, the Cu—P—Sn—Ni brazing filler material 25, and the Cu foil 22 which forms into the circuit layer 12 are sequentially laminated at a position on the first surface of the ceramic substrate 11 where the Ti paste 24 is formed (laminating step S02). That is, between the ceramic substrate 11 and the Cu foil 22, the Ti paste 24 is disposed close to the ceramic substrate 11, and the Cu—P—Sn—Ni brazing filler material 25 is disposed.

The Ti paste 24 and the Cu—P—Sn—Ni brazing filler material 25 may be disposed reversely. In this case, the Cu—P—Sn—Ni brazing filler material 25 is disposed close to the ceramic substrate 11, and the Ti paste 24 is disposed close to the Cu foil 22.

In the embodiment, thickness of the Ti paste 24 printed on the first surface of the ceramic substrate 11, after being dried, is set to be in a range of 10 μm to 200 μm.

In the embodiment, the compositions of the Cu—P—Sn—Ni brazing filler material 25 are Cu, 7 mass % of P, 15 mass % of Sn, and 10 mass % of Ni. The thickness of the Cu—P—Sn—Ni brazing filler material 25 is set to be in a range of 5 μm to 150 μm. In the embodiment, the thickness of the Cu—P—Sn—Ni brazing filler material 25 is set to be 30 μm.

Subsequently, the ceramic substrate 11, the Ti paste 24, the Cu—P—Sn—Ni brazing filler material 25, and the Cu foil 22 are placed into and heated in a vacuum heating furnace while being pressurized (at a pressure of 1 $kgf/cm^2$ to 35 $kgf/cm^2$ (0.10 MPa to 3.43 MPa)) in a laminating direction (heating step S03). In the embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S03, the Cu—P—Sn—Ni brazing filler material 25 is melted to form a liquid phase, the Ti paste 24 is melted into the liquid phase, and the liquid phase is solidified. Thereby, the ceramic substrate 11 and the Cu foil 22 are bonded to each other. At this time, P and Ni contained in the Cu—P—Sn—Ni brazing filler material 25 are combined with Ti powder contained in the Ti paste 24. Therefore, the intermetallic compounds 17 are formed. Between the ceramics substrate 11 and the circuit layer, the Cu—Sn layer 14 of which matrix does not contain P and Ni or contains P and Ni with a very small amount, is formed.

As a result, the circuit layer 12 is formed on the first surface of the ceramic substrate 11 such that the power module substrate 10 in the embodiment is produced.

Subsequently, the semiconductor element 3 is bonded to the upper surface of the circuit layer 12 of the power module substrate 10 through the solder material (semiconductor element-bonding step S04).

As such, the power module 1 in the embodiment is produced.

In the power module substrate 10 with such a configuration according to the embodiment, at the bonded interface between the ceramic substrate 11 and the circuit layer 12, P and Ni contained in the Cu—P—Sn—Ni brazing filler material 25 are drawn into the intermetallic compounds 17. Thereby, the Cu—Sn layer 14 is formed and the intermetallic compounds 17 are dispersed in the Cu—Sn layer 14. That is, since a rigid intermetallic compound is not formed at the bonded interface between the ceramic substrate 11 and the Cu—Sn layer 14, it is possible to reduce thermal stress generating in the ceramic substrate 11 when the power module substrate 10 undergoes a thermal cycle. As a result, it is possible to limit the occurrence of cracking in the ceramic substrate 11. Since a rigid intermetallic compound is not formed at the bonded interface between the ceramic substrate 11 and the Cu—Sn layer 14, the bonding rate between the ceramic substrate 11 and the circuit layer 12 is improved, and the ceramic substrate 11 and the circuit layer 12 are sufficiently bonded to each other.

In the power module substrate 10 and the power module 1 according to the embodiment, the circuit layer 12 made of the Cu foil 22 is formed on the first surface of the ceramic substrate 11, and thus it is possible to spread out heat from the semiconductor element 3, and to dissipate heat to the ceramic substrate 11. Since the Cu foil 22 has a relatively high resistance to deformation, when the power module substrate 10 undergoes a thermal cycle, it is possible to limit deformation of the circuit layer 12, and deformation of the bonding layer 2 bonding the semiconductor element 3 to the circuit layer 12. As a result, it is possible to improve the reliability of bonding.

According to the method of producing the power module substrate 10 in the embodiment, since the ceramic substrate 11 and the Cu foil 22 is subjected to a heating process with the Cu—P—Sn—Ni brazing filler material 25 and the Ti paste 24 being interposed therebetween, during heating, Ti is melted into the liquid phase of the melted Cu—P—Sn—Ni brazing filler material 25, and wettability between the ceramic substrate 11 and the liquid phase of the Cu—P—Sn—Ni brazing filler material 25 is improved.

When the heating temperature is 600° C. or higher in the heating step S03, the Cu—P—Sn—Ni brazing filler material 25 can be reliably melted at the bonded interface between the ceramic substrate 11 and the Cu foil 22. Therefore, the ceramic substrate 11 and the Cu foil 22 can be reliably bonded to each other. When the heating temperature is 650° C. or less, it is possible to limit the thermal degradation of the ceramic substrate 11, and to reduce thermal stress generating in the ceramic substrate 11. For this reason, in the embodiment, the heating temperature is set to be in a range of 600° C. to 650° C.

When pressure applied to the ceramic substrate 11 and the like is 1 kgf/cm² (0.10 MPa) or greater in the heating step S03, since the ceramic substrate 11 (or the Ti paste 24 on the ceramic substrate 11) is capable of coming into close contact with the liquid phase of the Cu—P—Sn—Ni brazing filler material 25, the ceramic substrate 11 and the Cu—Sn layer 14 can be sufficiently bonded to each other. When the applied pressure is 35 kgf/cm² (3.43 MPa) or less, it is possible to limit the occurrence of cracking in the ceramic substrate 11. For this reason, in the embodiment, the applied pressure is set to be in a range of 1 kgf/cm² to 35 kgf/cm² (0.10 MPa to 3.43 MPa).

When the heating time is 30 minutes or more in the heating step S03, since it is possible to ensure a sufficient amount of time required when P contained in the melted Cu—P—Sn—Ni brazing filler material 25 is combined with Ti contained in the Ti powder at the bonded interface between the ceramic substrate 11 and the Cu foil 22, the Cu—Sn layer can be reliably formed close to the ceramic substrate 11. Even when the heating time exceeds 360 minutes, bondability between the ceramic substrate 11 and the circuit layer 12 is not improved compared to the case in which the heating time is 360 minutes. When the heating time exceeds 360 minutes, productivity is decreased. For this reason, in the embodiment, the heating time is set to be in a range of 30 minutes to 360 minutes.

In the embodiment, since the Cu—P—Sn—Ni brazing filler material 25 with a melting point of 580° C. is used, it is possible to form a liquid phase of the brazing filler material at a low temperature.

Second Embodiment

Hereinafter, a second embodiment of the present invention will be described. The same reference signs will be assigned to the same configuration elements as in the first embodiment, and detailed descriptions thereof will be omitted.

Figure 6:
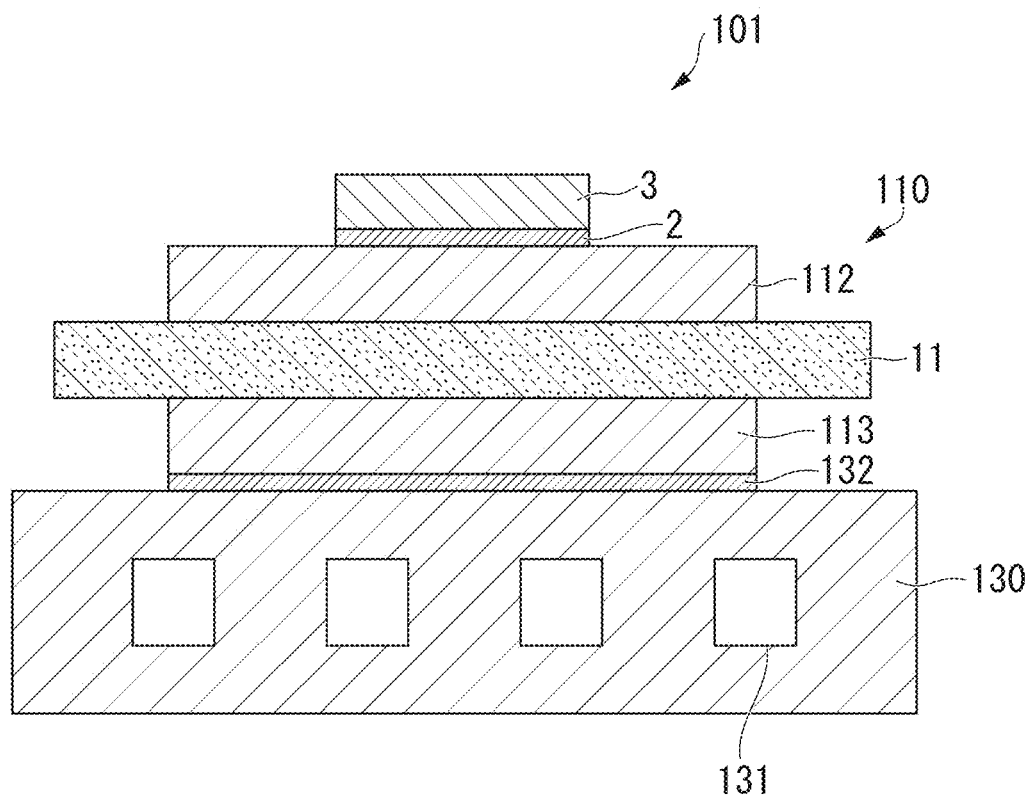
FIG. 6 is a schematic view of a power module in which a power module substrate is used in a second embodiment of the present invention.

FIG. 6 shows a power module 101 including a power module substrate 110 in the second embodiment.

The power module 101 includes: the power module substrate 110 in which a circuit layer 112 is provided on the first surface of the ceramic substrate 11; the semiconductor element 3 that is bonded to a surface at one side (an upper surface in FIG. 6) of the circuit layer 112 through the bonding layer 2; and a heat sink 130 disposed on the other side (a lower side in FIG. 6) of the power module substrate 110.

Figure 7:
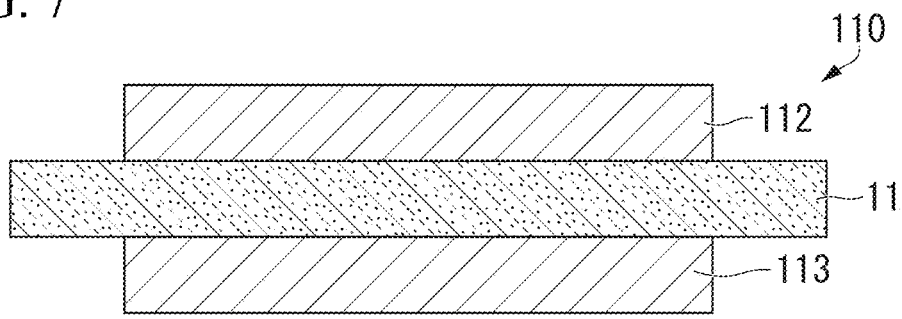
FIG. 7 is a schematic view of the power module substrate in the second embodiment of the present invention.

As shown in FIG. 7, the power module substrate 110 includes: the ceramic substrate 11; the circuit layer 112 provided on the first surface (an upper surface in FIG. 7) which is one surface of the ceramic substrate 11; and a metal layer 113 provided on the second surface (a lower surface in FIG. 7) which is the other surface of the ceramic substrate 11.

The ceramic substrate 11 is made of aluminum nitride (AlN) having good heat radiation.

Figure 9:
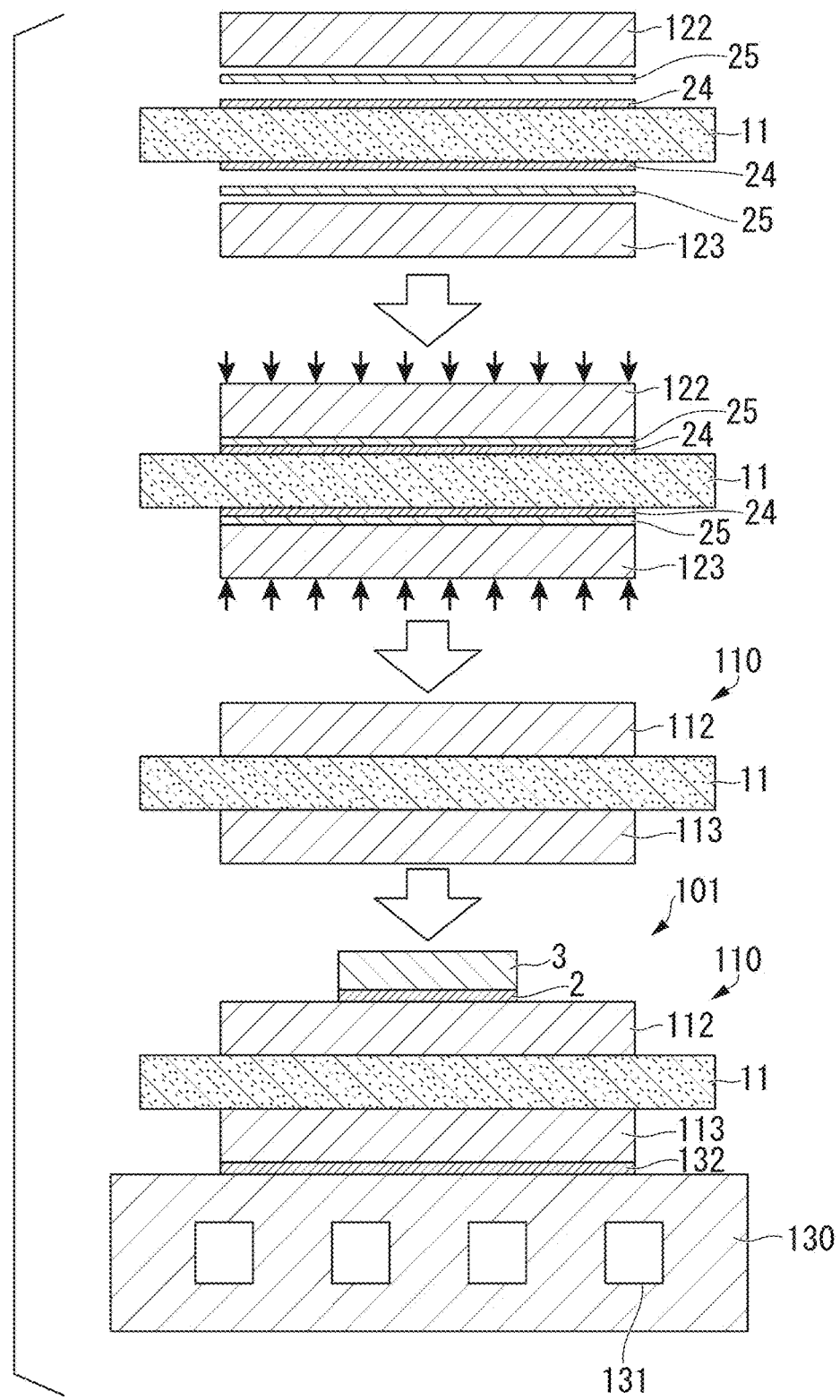
FIG. 9 shows schematic views showing the method of producing the power module substrate and the power module in the second embodiment of the present invention.

Similar to the first embodiment, the circuit layer 112 is formed by bonding a Cu foil 122 to the ceramic substrate 11 through the heating of the Ti paste 24 as the Ti material, the Cu—P—Sn—Ni brazing filler material 25, and the Cu foil 122 made of oxygen-free copper, which are sequentially laminated on the first surface of the ceramic substrate 11 (refer to FIG. 9).

The thickness of the circuit layer 112 is set to be in a range of 0.1 mm to 1.0 mm. In the second embodiment, the thickness is set to 0.6 mm.

Similar to the first embodiment, the Cu—Sn layer (a first Cu—Sn layer) 14 is formed at the bonded interface between the ceramic substrate 11 and the circuit layer 112. The intermetallic compounds (first intermetallic compounds) 17 containing P, Ni, and Ti are dispersed in the Cu—Sn layer 14.

The metal layer 113 is formed by bonding a metal plate made of Cu or a Cu alloy to the second surface which is the other surface of the ceramic substrate 11 through a Cu—P—Sn-based brazing filler material and a Ti material. In the second embodiment, the metal layer 113 is formed by bonding the Cu foil 123 to the ceramic substrate 11 through the heating of the Ti paste 24 as the Ti material, the Cu—P—Sn—Ni brazing filler material 25, and the Cu foil 123 made of oxygen-free copper, which are sequentially laminated on the second surface of the ceramic substrate 11 (refer to FIG. 9).

The thickness of the metal layer 113 is set to be in a range of 0.1 mm to 1.0 mm. In the embodiment, the thickness is set to 0.6 mm.

Similar to the bonded interface between the ceramic substrate 11 and the circuit layer 112, a Cu—Sn layer (a second Cu—Sn layer) 14 is formed at a bonded interface between the ceramic substrate 11 and the metal layer 113. In the Cu—Sn layer 14, intermetallic compounds (second intermetallic compounds) 17 containing P, Ni, and Ti are dispersed. That is, the Cu—Sn layer (the second Cu—Sn layer) 14 close to the metal layer 113 has substantially the same structure as that of the Cu—Sn layer (the first Cu—Sn layer) 14 close to the circuit layer 112, and the intermetallic compounds (the second intermetallic compounds) 17 close to the metal layer 113 have substantially the same structure as that of the intermetallic compounds (the first intermetallic compounds) 17 close to the circuit layer 112.

The heat sink 130 dissipates heat from the power module substrate 110. The heat sink 130 is made of Cu or a Cu alloy. In the embodiment, the heat sink 130 is made of oxygen-free copper. The heat sink 130 is provided with flow passages 131 through which a coolant flows. In the embodiment, the heat sink 130 and the metal layer 113 are bonded to each other through a solder layer 132 made of a solder material.

Figure 8:
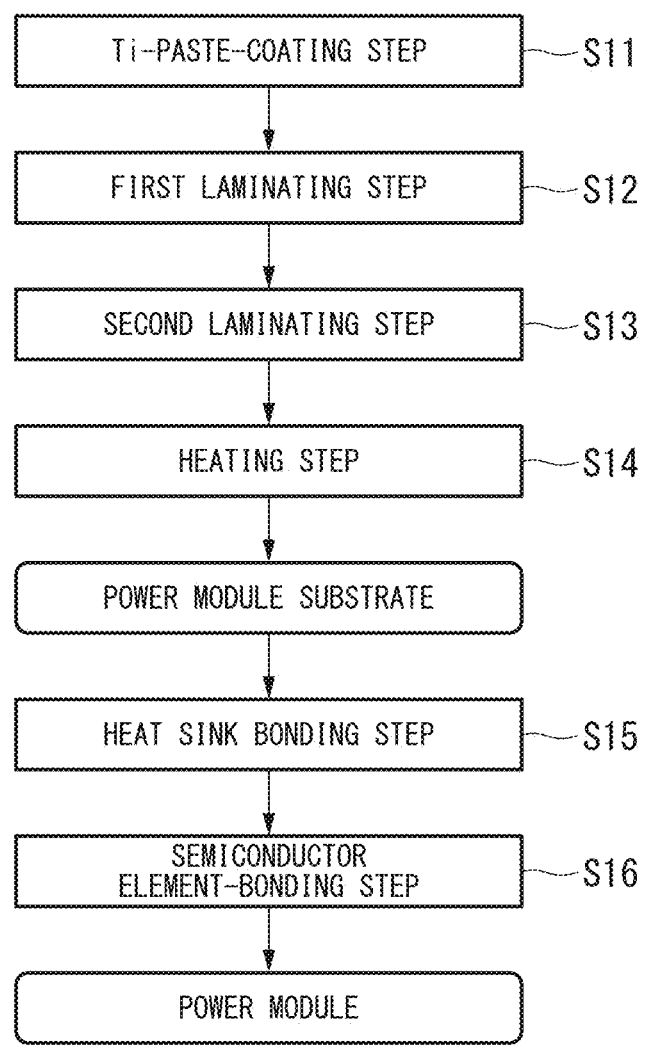
FIG. 8 is a flowchart showing a method of producing the power module substrate and the power module in the second embodiment of the present invention.

Hereinafter, a method of producing the power module 101 in the embodiment will be described with reference to the flowchart in FIG. 8, and FIG. 9.

First, as shown in FIG. 9, the Ti paste 24 is applied on the first surface (an upper surface in FIG. 9) and the second surface (an lower surface in FIG. 9) of the ceramic substrate 11 using screen-printing, and then dried (Ti-paste coating step S11).

Subsequently, as shown in FIG. 9, the Cu—P—Sn—Ni brazing filler material 25, and the Cu foil 122 which forms into the circuit layer 112 are sequentially laminated on the first surface of the ceramic substrate 11 (first laminating step S12). In addition to this, the Cu—P—Sn—Ni brazing filler material 25, and the Cu foil 123 which forms into the metal layer 113 are sequentially laminated on the second surface of the ceramic substrate 11 (second laminating step S13). That is, between the ceramic substrate 11 and each of the Cu foils 122, 123, the Ti paste 24 is disposed close to the ceramic substrate 11, and the Cu—P—Sn—Ni brazing filler material 25 is disposed close to each of the Cu foils 122, 123.

The Ti paste 24 and the Cu—P—Sn—Ni brazing filler material 25 may be disposed reversely. In this case, the Cu—P—Sn—Ni brazing filler material 25 is disposed close to the ceramic substrate 11, and the Ti paste 24 is disposed close to each of the Cu foil 122, 123.

Subsequently, the ceramic substrate 11, the Ti paste 24, the Cu—P—Sn—Ni brazing filler material 25, and the Cu foils 122, 123 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S14). In the second embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S14, the Cu—P—Sn—Ni brazing filler material 25 is melted to form a liquid phase, the Ti paste 24 is melted into the liquid phase, and the liquid phase is solidified. Thereby, the ceramic substrate 11 is bonded to each of the Cu foils 122 and 123.

Accordingly, the circuit layer 112 and the metal layer 113 are respectively formed on the first surface and the second surface of the ceramic substrate 11, and thereby the power module substrate 110 in the embodiment is produced.

Subsequently, the heat sink 130 is bonded to a lower surface of the metal layer 113 of the power module substrate 110 through a solder material (heat sink bonding step S15).

Subsequently, the semiconductor element 3 is bonded to the upper surface of the circuit layer 112 of the power module substrate 110 through a solder material (semiconductor element-bonding step S16).

As such, the power module 101 in the embodiment is produced.

The power module substrate 110 with such a configuration according to the second embodiment provides the same effects as the power module substrate 10 in the first embodiment.

The metal layer 113 made of the Cu foil 123 is formed on the second surface of the ceramic substrate 11, and thus the power module substrate 110 is capable of efficiently dissipating heat from the semiconductor element 3 through the metal layer 113.

Similar to the bonded interface between the ceramic substrate 11 and the circuit layer 112, at a bonded interface between the ceramic substrate 11 and the metal layer 113, P and Ni contained in the Cu—P—Sn—Ni brazing filler material 25 are drawn into the intermetallic compounds 17. Thereby, the Cu—Sn layer 14 is formed and the intermetallic compounds 17 are dispersed in the Cu—Sn layer 14. That is, since a rigid intermetallic compound is not formed at the bonded interface between the ceramic substrate 11 and the Cu—Sn layer 14, it is possible to reduce thermal stress generating in the ceramic substrate 11 when the power module substrate 110 undergoes a thermal cycle. As a result, it is possible to limit the occurrence of cracking in the ceramic substrate 11. Since a rigid intermetallic compound layer is not formed at the bonded interface between the ceramic substrate 11 and the Cu—Sn layer 14, the bonding rate between the ceramic substrate 11 and the metal layer 113 is improved, and the ceramic substrate 11 and the metal layer 113 are sufficiently bonded to each other.

Since the heat sink 130 is bonded to the metal layer 113, the power module substrate 110 in the second embodiment is capable of efficiently dissipating heat through the heat sink 130.

According to the method of producing the power module substrate 110 in the second embodiment, the circuit layer 112 and the metal layer 113 are respectively bonded to the first surface and the second surface of the ceramic substrate 11, simultaneously. As a result, it is possible to simplify a producing process, and to reduce producing costs.

Third Embodiment

Hereinafter, a third embodiment of the present invention will be described. The same reference signs will be assigned to the same configuration elements as in the first embodiment, and detailed descriptions thereof will be omitted.

Figure 10:
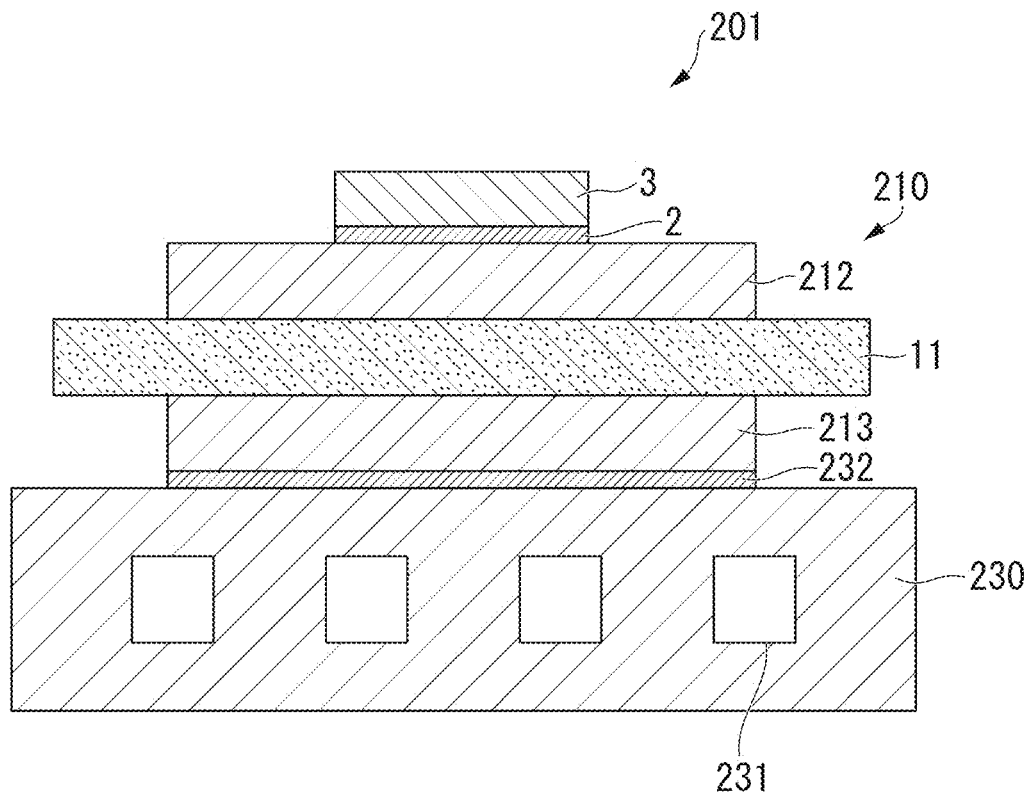
FIG. 10 is a schematic view of a power module in which a power module substrate in a third embodiment of the present invention is used.

FIG. 10 shows a power module 201 including a power module substrate 210 in the third embodiment.

The power module 201 includes: the power module substrate 210 in which a circuit layer 212 is provided on the first surface of the ceramic substrate 11; the semiconductor element 3 that is bonded to a surface at one side (an upper surface in FIG. 10) of the circuit layer 212 through the bonding layer 2; and a heat sink 230 bonded to the other side (a lower side in FIG. 10) of the power module substrate 210 through a bonding layer 232.

Figure 11:
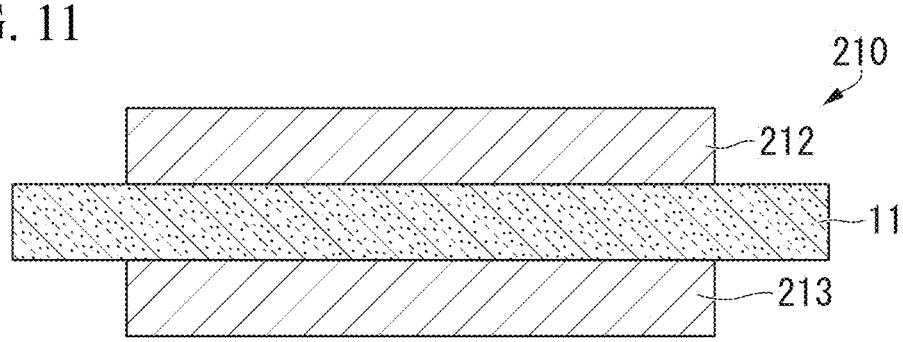
FIG. 11 is a schematic view of the power module substrate in the third embodiment of the present invention.

As shown in FIG. 11, the power module substrate 210 includes: the ceramic substrate 11; the circuit layer 212 provided on the first surface (an upper surface in FIG. 11) which is one surface of the ceramic substrate 11; and a metal layer 213 provided on the second surface (a lower surface in FIG. 11) which is the other surface of the ceramic substrate 11.

The ceramic substrate 11 is made of aluminum nitride (AlN) having good heat radiation.

Figure 13:
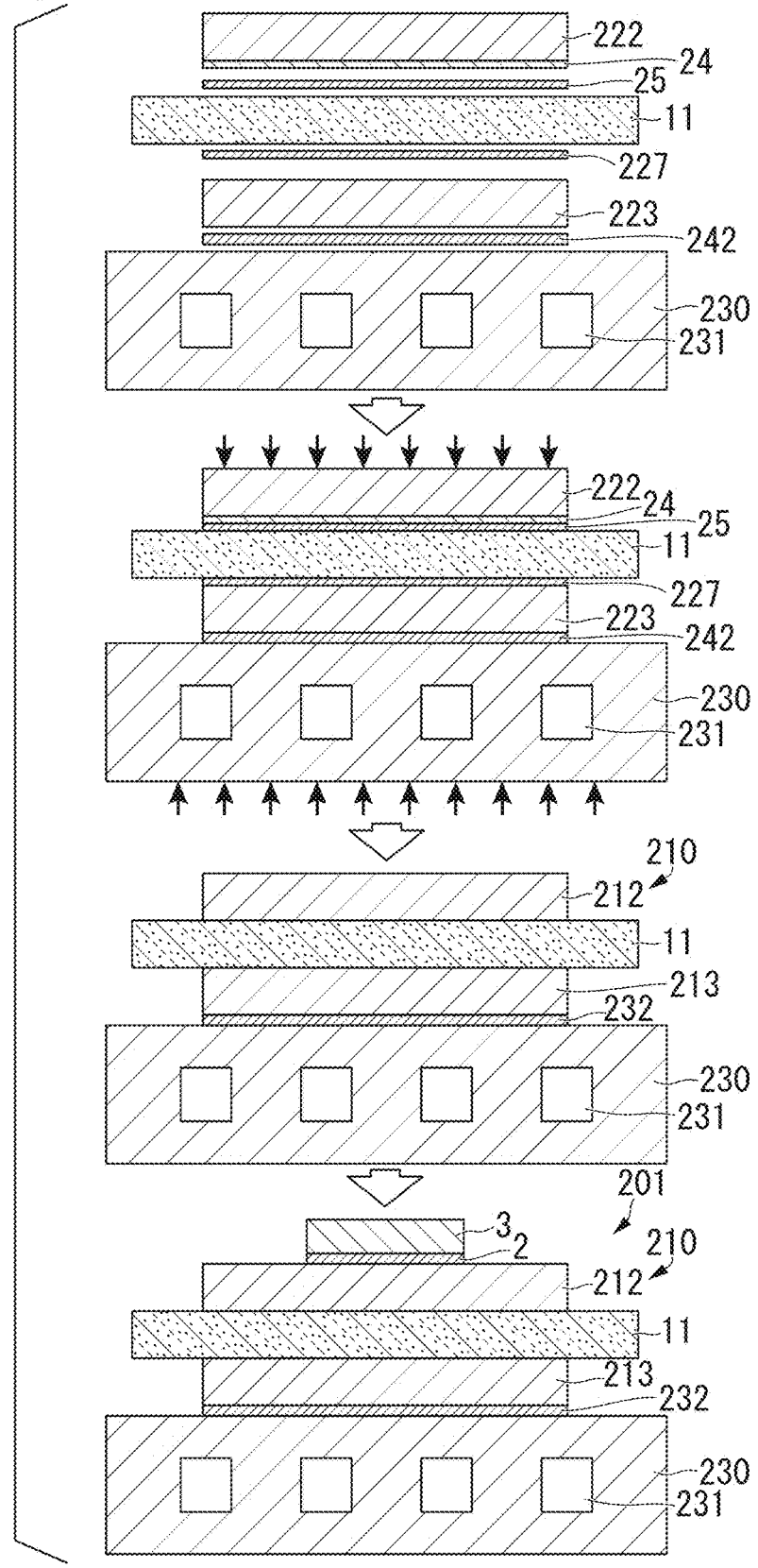
FIG. 13 shows schematic views showing the method of producing the power module substrate and the power module in the third embodiment of the present invention.

The circuit layer 212 is formed by bonding a Cu foil 222 to the ceramic substrate 11 through the heating of the Cu—P—Sn—Ni brazing filler material 25, Ti paste 24 as the Ti material, and the Cu foil 222 made of oxygen-free copper, which are sequentially laminated on the first surface of the ceramic substrate 11 (refer to FIG. 13).

The thickness of the circuit layer 212 is set to be in a range of 0.1 mm to 1.0 mm. In the third embodiment, the thickness is set to 0.6 mm.

Similar to the first embodiment, the Cu—Sn layer 14 is formed at the bonded interface between the ceramic substrate 11 and the circuit layer 212. The intermetallic compounds 17 containing P, Ni, and Ti are dispersed in the Cu—Sn layer 14.

The metal layer 213 is formed by bonding a metal plate made of Al or an Al alloy to the second surface which is the other surface of the ceramic substrate 11 through a bonding material 227. In the third embodiment, the metal layer 213 is formed by bonding an Al plate 223 with a purity of 99.99 mass % or more to the second surface of the ceramic substrate 11 (refer to FIG. 13).

The thickness of the metal layer 213 is set to be in a range of 0.1 mm to 3.0 mm. In the embodiment, the thickness is set to 1.6 mm.

The heat sink 230 is made of Al or an Al alloy. In the embodiment, the heat sink 230 is made of A6063 (Al alloy). The heat sink 230 is provided with flow passages 231 through which a coolant flows. The heat sink 230 and the metal layer 213 are bonded to each other through an Al—Si-based brazing filler material.

Figure 12:
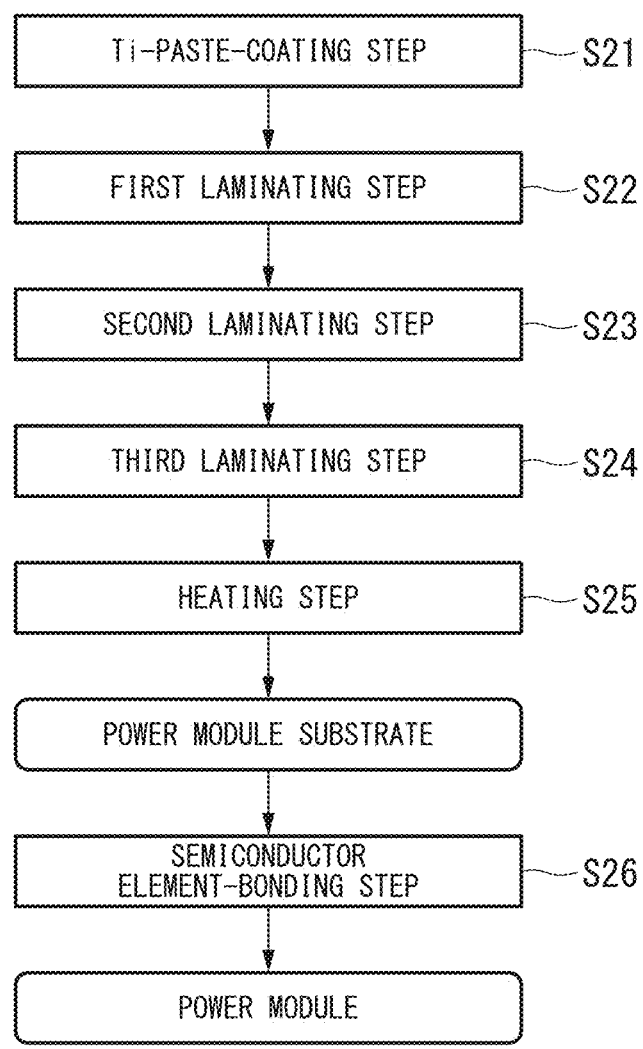
FIG. 12 is a flowchart showing a method of producing the power module substrate and the power module in the third embodiment of the present invention.

Hereinafter, a method of producing the power module 201 in the embodiment will be described with reference to the flowchart in FIG. 12, and FIG. 13.

First, as shown in FIG. 13, the Ti paste 24 is applied on the lower surface (bonded surface) of the Cu foil 222 which forms into the circuit layer 212 using screen-printing, and then dried (Ti-paste coating step S21).

Subsequently, the Cu—P—Sn—Ni brazing filler material 25, and the Cu foil 222 are sequentially laminated on the first surface (an upper surface in FIG. 13) of the ceramic substrate 11 (first laminating step S22). The bonding material 227 and the Al plate 223 which forms into the metal layer 213 are sequentially laminated on the second surface (a lower surface in FIG. 13) of the ceramic substrate 11 with the bonding material 227 interposed between the Al plate 223 and the ceramic substrate 11 (second laminating step S23). The heat sink 230 is laminated on a lower side of the Al plate 223 with a bonding material 242 interposed between the heat sink 230 and the Al plate 223 (third laminating step S24). In the first laminating step S22, the Cu—P—Sn—Ni brazing filler material 25 is disposed so as to overlap with the Ti paste 24 printed on the Cu foil 222.

In the embodiment, the bonding materials 227 and 242 are Al—Si-based brazing filler materials containing Si which lowers a melting point. In the third embodiment, an Al—Si (7.5 mass %) brazing filler material is used.

Subsequently, the ceramic substrate 11, the Cu—P—Sn—Ni brazing filler material 25, the Ti paste 24, the Cu foil 222, the bonding material 227, the Al plate 223, the bonding material 242, and the heat sink 230 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S25). In the third embodiment, the internal pressure of the vacuum heating furnace is set to be in a range of $10^{-6}$ Pa to $10^{-3}$ Pa, the heating temperature is set to be in a range of 600° C. to 650° C., and the heating time is set to be in a range of 30 minutes to 360 minutes.

In the heating step S25, the Cu—P—Sn—Ni brazing filler material 25 is melted to form a liquid phase, the Ti paste 24 is melted into the liquid phase, and the liquid phase is solidified. Thereby, the ceramic substrate 11 is bonded to the Cu foil 222. In the heating step S25, the bonding material 227 is melted to form a liquid phase, and the liquid phase is solidified. Thereby, the ceramic substrate 11 and the Al plate 223 are bonded to each other through the bonding material 227. In the heating step S25, the bonding material 242 is melted to form a liquid phase, and the liquid phase is solidified. Thereby, the Al plate 223 and the heat sink 230 are bonded to each other through the bonding material 242.

Accordingly, the power module substrate 210 in the third embodiment is produced.

Subsequently, the semiconductor element 3 is bonded to the upper surface of the circuit layer 212 of the power module substrate 210 through a solder material (semiconductor element-bonding step S26).

As such, the power module 201 in the third embodiment is produced.

The power module substrate 210 with such a configuration according to the third embodiment provides the same effects as the power module substrate 10 in the first embodiment.

The Al plate 223 is bonded to the second surface of the ceramic substrate 11 such that the metal layer 213 is formed, and thus the power module substrate 210 in the third embodiment is capable of efficiently dissipating heat from the semiconductor element 3 through the metal layer 213. Since Al has a relatively low resistance to deformation, when the power module substrate 210 undergoes a thermal cycle, the metal layer 213 is capable of absorbing thermal stress occurring between the power module substrate 210 and the heat sink 230. As a result, it is possible to limit the occurrence of cracking in the ceramic substrate 11.

According to the method of producing the power module substrate 210 in the third embodiment, the circuit layer 212 and the metal layer 213 are respectively bonded to the first surface and the second surface of the ceramic substrate 11 simultaneously. At this time, the heat sink 230 is also bonded to the metal layer 213 simultaneously. As a result, it is possible to simplify a producing process, and to reduce producing costs.

In the embodiment the Ti paste 24 is applied on the lower surface (bonded surface) of the Cu foil 222; however, the Ti paste 24 can be applied on the first surface of the ceramic substrate 111. In this case, the Ti paste 24 is disposed close to the ceramic substrate 11 and the Ci-P—Sn—Ni brazing filler material 25 is disposed close to the Cu foil 222.

Fourth Embodiment

Hereinafter, a fourth embodiment of the present invention will be described. The same reference signs will be assigned to the same configuration elements as in the first embodiment, and detailed descriptions thereof will be omitted.

Figure 14:
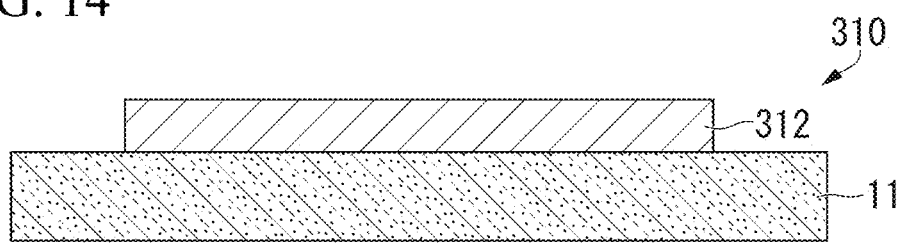
FIG. 14 is a schematic view of a power module substrate in a fourth embodiment of the present invention.

FIG. 14 shows a power module substrate 310 in the fourth embodiment.

As shown in FIG. 14, the power module substrate 310 includes: the ceramic substrate 11; the circuit layer 312 provided on one surface (an upper surface in FIG. 14) of the ceramic substrate 11.

The ceramic substrate 11 is made of aluminum nitride (AlN) having good heat radiation.

Figure 17:
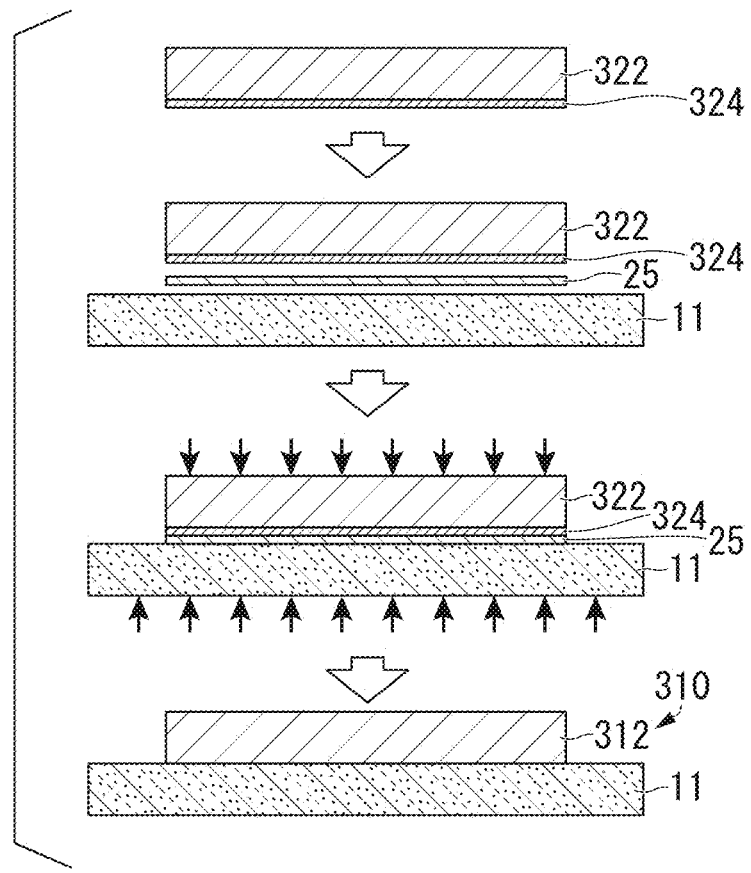
FIG. 17 shows schematic views showing the method of producing the power module substrate in the fourth embodiment of the present invention.

The circuit layer 312 is formed by bonding a Cu foil 322 to the ceramic substrate 11 through the heating of the Cu—P—Sn—Ni brazing filler material 25, the Ti paste 324 as the Ti material, and the Cu foil 322 made of oxygen-free copper, which are sequentially laminated on the first surface which is the one surface of the ceramic substrate 11 (refer to FIG. 17).

In the embodiment, the Ti paste 324 is a paste containing $TiH_2$ powder (hydrogenated titanium powder), resin, a solvent, and a dispersant. The Ti paste 324 may contain a plasticizer, if needed.

The Ti paste 324 includes: 3 mass % to 50 mass % of the $TiH_2$ powder; and the balance containing organic elements (including the resin, the solvent, the dispersant, and the plasticizer).

The viscosity of the Ti paste 324 is set to be in the range of 10 Pa·s to 500 Pa·s, preferably 50 Pa·s to 300 Pa's.

Since the $TiH_2$ powder has a lower reactivity than that of metallic titanium powder, it is possible to make the particle diameter of the $TiH_2$ powder smaller. In the embodiment, the particle diameter of the $TiH_2$ powder is set to be 15 μm or less, preferably 5 μm or less.

For example, ethyl cellulose, acrylic resin, and the like can be used as the resin. In the embodiment, the acrylic resin is used.

For example, terpineol-based solvent, acetate-based solvent, citrate-based solvent and the like can be used as the solvent. In the embodiment, α-terpineol is used.

An anionic surface-acting agent, a cationic surface-acting agent, and the like can be used as the dispersant. In the embodiment, the anion surface-acting agent is used.

A dibutyl phthalate, a dibutyl adipate and the like can be used as the plasticizer.

Figure 15:
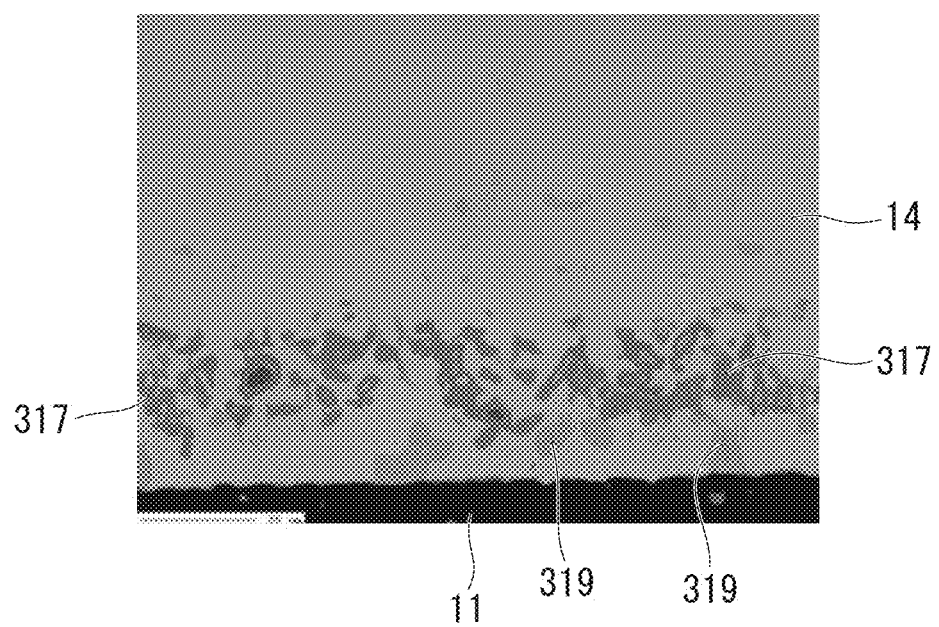
FIG. 15 is an electron micrograph obtained by capturing an image of the section of the bonded interface between a circuit layer and a ceramic substrate shown in FIG. 14.

As shown in FIG. 15, the Cu—Sn layer 14 is formed at the bonded interface between the ceramic substrate 11 and the circuit layer 312. The intermetallic compounds 317 containing P, Ni, and Ti are dispersed in the Cu—Sn layer 14.

In the embodiment, the intermetallic compounds 317 are dispersed lamellarly at the position where the Ti paste 324 is disposed. In the embodiment, Ti particles are absent at the center portions of most of the intermetallic compounds 317. It is estimated that this is because the particle diameter of the $TiH_2$ powder is fine, and thus Ti contained in the $TiH_2$ powder is consumed for formation of the intermetallic compounds 317.

$Cu_3P$ phases 319 are observed at the bonded interface between the ceramic substrate 11 and the circuit layer 312. It is estimated that P which has not reacted with Ti reacts with Cu and thereby the $Cu_3P$ phases 319 are formed.

Figure 16:
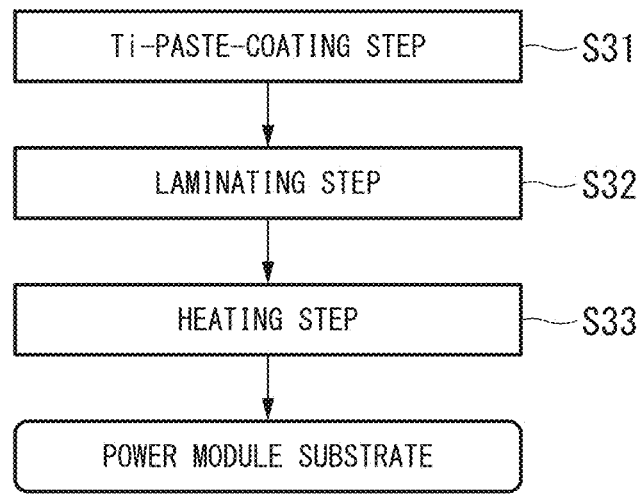
FIG. 16 is a flowchart showing a method of producing the power module substrate in the fourth embodiment of the present invention.

Hereinafter, a method of producing the power module substrate 310 in the embodiment will be described with reference to the flowchart in FIG. 16, and FIG. 17.

First, as shown in FIG. 17, the Ti paste 324 is applied on the lower surface (bonded surface) of the Cu foil 322 which forms into the circuit layer 312 using screen-printing, and then dried (Ti-paste coating step S31).

In the embodiment, in the Ti paste coating step S31, the coating amount of the Ti paste 324 is adjusted so that the film thickness of the Ti paste 324 after being dried is 5 μm to 200 μm. At this time, the amount of $TiH_2$ applied on the lower surface of the Cu foil 322 is set to be 0.01 mg/cm$^2$ to 12 mg/cm$^2$. It is more preferable to apply the Ti paste so that the amount of $TiH_2$ is 0.04 mg/cm$^2$ to 8 mg/cm$^2$.

Subsequently, the Cu—P—Sn—Ni brazing filler material 25, and the Cu foil 322 are sequentially laminated on the first surface (an upper surface in FIG. 1) of the ceramic substrate 11 (laminating step S32).

Subsequently, the ceramic substrate 11, the Cu—P—Sn—Ni brazing filler material 25 the Ti paste 324, and the Cu foil 322 are placed into and heated in a vacuum heating furnace while being pressurized (at a pressure of 1 kgf/cm$^2$ to 35 kgf/cm$^2$ (0.10 MPa to 3.43 MPa)) in a laminating direction (heating step S25). In the fourth embodiment, the internal pressure of the vacuum heating furnace is set to be in a range of 10$^{-6}$ Pa to 10$^{-3}$ Pa, the heating temperature is set to be in a range of 600° C. to 650° C., and the heating time is set to be in a range of 30 minutes to 360 minutes. It is more preferable to set the heating time to be in a range of 30 minutes to 240 minutes.

In the heating step S33, the Cu—P—Sn—Ni brazing filler material 25 is melted to form a liquid phase, the Ti paste 324 is melted into the liquid phase, and the liquid phase is solidified. Thereby, the ceramic substrate 11 is bonded to the Cu foil 322.

Accordingly, the power module substrate 310 in the fourth embodiment is produced.

The power module substrate 310 with such a configuration according to the fourth embodiment provides the same effects as the power module substrate 10 in the first embodiment.

In the power module substrate 310 according to the fourth embodiment, since the Ti paste 324 containing the fine $TiH_2$ powder is used, the surface area of $TiH_2$ powder is large. Therefore, the reaction of Ti proceeds rapidly. Accordingly, it is possible to reliably bond the ceramic substrate 11 and the Cu foil 322 to each other even under a condition with a relatively short amount of time.

In the embodiment, the Ti paste 324 is applied on the lower surface (the bonded surface) of the Cu foil 322; however, the Ti paste 324 can be applied on the first surface of the ceramic substrate 11. In this case, the Ti paste 324 is disposed close to the ceramic substrate 11, and the Cu—P—Sn—Ni brazing filler material 25 is disposed close to the Cu foil 322.

The embodiments of the present invention have been described; however, the present invention is not limited to the embodiments, and modifications can be appropriately made to the embodiments insofar as the modifications do not depart from the technical spirit of the invention.

In the above-described embodiments, screen-printing is used for the application of the Ti paste; however, various methods such as offset printing and a photosensitive process can be used.

In the embodiments, Ti paste and the Cu—P—Sn-based brazing filler material are disposed between the ceramic substrate and the Cu foil; however, the present invention is not limited to the Ti paste. For example, Ti powder and the Cu—P—Sn-based brazing filler material may be disposed between the ceramic substrate and the Cu foil.

In the above-described method of producing the power module substrate, the step of degreasing the Ti paste can be provided between the Ti-paste coating step and the laminating step. In this case, a residual amount of the resin contained in the Ti paste is decreased, thereby the bondability is further improved.

In the second and third embodiments, the circuit layer and the metal layer are respectively bonded to the first surface and the second surface of the ceramic substrate simultaneously; however, the circuit layer and the metal layer may be independently bonded to the surfaces of the ceramic substrate.

In the third embodiment, the bonding of the circuit layer, the metal layer, and the heat sink is performed simultaneously; however, after the circuit layer and the metal layer are bonded to the ceramic substrate, the metal layer and the heat sink may be bonded to each other.

In the third embodiment, the metal layer is bonded to the second surface of the ceramic substrate through an Al—Si-based brazing filler material; however, the metal layer may be bonded to the second surface of the ceramic substrate by a transient liquid phase (TLP) bonding method, an Ag paste, or the like.

In the second and third embodiments, the heat sink with the flow passages are used; however, a plate-like heat sink called a heat radiation plate, or a heat sink with pin-like fins may be used. The power module substrate and the heat sink are bonded to each other through a solder material or a brazing filler material; however, grease may be applied between the power module substrate and the heat sink, and the power module substrate and the heat sink may be fixed together with screws. In the power module substrates according to the second and third embodiments, the heat sink may not be bonded to the other surface of the power module substrate (the second surface of the ceramic substrate).

In the fourth embodiment, Ti particles are absent in the center portions of most of the intermetallic compounds 317 which are dispersed at the bonded interface between the ceramic substrate 11 and the circuit layer 312; however, the intermetallic compounds 317 may have a core-shell structure of which the center portion has Ti particle, as shown in FIG. 2.

In the fourth embodiment, the $Cu_3P$ phases 319 are observed at the bonded interface between the ceramic substrate 11 and the circuit layer 312; however, the $Cu_3P$ phase 319 may be absent at the bonded interface.

In the above-described e embodiments, the Ti paste containing Ti powder or $TiH_2$ powder is used; however, a Ti foil and a Ti vapor-deposited film can be used instead of the Ti paste. In this case, the amount of Ti therein may be preferably 0.01 $mg/cm^2$ to 3.6 $mg/cm^2$, more preferably 0.04 $mg/cm^2$ to 2.3 $mg/cm^2$. The position where the Ti foil or the Ti vapor-deposited film is disposed is not limited, and they may be disposed closed to either ceramic substrate or Cu member.

In the embodiments, a brazing filler foil is used as the Cu—P—Sn-based brazing filler material; however, a brazing filler paste containing a powder of the Cu—P—Sn-based brazing filler material can be used. The brazing filler paste can be prepared by using the powder of the Cu—P—Sn-based material instead of the Ti powder in the above-described Ti paste.

In addition, the paste (brazing filler-Ti paste) in which the brazing filler paste and the Ti paste are mixed can be used. In this case, the brazing filler-Ti paste may be applied on at least one of the ceramic substrate or the Cu foil.

EXAMPLES

Example 1

Hereinafter, results of confirmation tests (Example 1) performed to confirm the effects of the embodiments of the present invention will be described.

Sheets of Ti material; Cu—P—Sn-based brazing filler material (37 mm×37 mm) with thicknesses shown in Tables 1 and 2; and Cu foils (37 mm×37 mm×0.3 mm thickness) made of oxygen-free copper were sequentially laminated on first surfaces of ceramic substrates (40 mm×40 mm) shown in Tables 1 and 2. In each of Examples 1-1 to 1-14 of the present invention. Ti paste was used as the Ti material. The Ti paste containing Ti powder with a particle diameter of 10 μm, acrylic resin, and texanol, was used. The Ti paste was applied on the ceramic substrate or the Cu foil using screen-printing so that the amount of Ti provided thereon is set to be the amount shown in Tables 1 and 2. The Ti paste and the Cu—P—Sn-based brazing filler material were positioned as shown in Tables 1 and 2. When the material of the ceramic substrate was AlN, the thickness of the ceramic substrate was set to 0.635 mm, and when the material was $Si_3N_4$, the thickness was set to 0.32 mm. In each of Examples 1-15 and 1-16 of the present invention, Ti foil was used as the Ti material in place of the Ti paste. The thickness of the Ti foil was adjusted so that the amount of Ti therein was set to be the amount shown in Table 2. In each of Examples 1-17 to 1-20 of the present invention, Ti vapor-deposited film was used as the Ti material in place of the Ti paste. The thickness of the Ti vapor-deposited film was adjusted so that the amount of Ti therein was set to be the amount shown in Table 2.

While being pressurized at a pressure of 15 $kgf/cm^2$ (1.47 MPa) in a laminating direction, the ceramic substrate, the Cu—P—Sn-based brazing filler material, and the Cu foil, which were laminated on each other, were placed into and heated in a vacuum heating furnace. Thereby, the Cu foil was bonded to the first surface of the ceramic substrate, and a circuit layer was formed. The internal pressure of the vacuum heating furnace was set to be in a range of $10^{-6}$ Pa to $10^{-3}$ Pa, and the heating temperature and the heating time were set to the conditions shown in Tables 1 and 2. As such, the power module substrates in Examples 1-1 to 1-20 of the present invention were obtained.

A power module substrate in Comparative Example 1 was obtained using a method which was the same as that used to obtain the power module substrates in Examples 1-1 to 1-20 except the fact that the ceramic substrate and the circuit layer were bonded to each other without using the Ti material.

In each of the power module substrates obtained in the aforementioned manner, the initial bonding rate between the circuit layer and the ceramic substrate was evaluated. A method of evaluating the bonding rate will be described below.

(Evaluation of Bonding Rate)

In the power module substrate, the bonding rate of the interface between the ceramic substrate and the circuit layer was evaluated by an ultrasonic flaw detector (FineSAT200 manufactured by Hitachi Power Solutions), and was calculated by the following expression.

An initial bonding area was an area before bonding, which has to be bonded. In the examples, the initial bonding area was the area (37 mm×37 mm) of the circuit layer. Exfoliation in an image obtained by binarizing an ultrasonic-detected image was shown by a white portion in a bonding portion, and thus the area of the white portion was deemed to be an exfoliation area.

(Bonding Rate (%))={(Initial Bonding Area)−(Exfoliation Area)}/(Initial Bonding Area)×100

Results of the aforementioned evaluations were shown in Tables 1 and 2.

TABLE 1

| | Cu—P—Sn-based Brazing Filler Material | | | | | Position of Cu—P—Sn-based | Material of | Heating Conditions | | Initial Bonding |
|---|---|---|---|---|---|---|---|---|---|---|
| | Components | Thickness μm | Melting Point | Ti Amount mg/cm² | Position of Ti Material | Brazing Filler Material | Ceramic Substrate | Temperature | Time | Rate % |
| Example 1-1 | Cu-6.3 mass % of P-9.3 mass % of Sn-7 mass % of Ni | 20 | 600° C. | 5 | Close to Ceramic Substrate | Close to Cu foil | AlN | 650° C. | 90 min. | 98.6 |
| Example 1-2 | Cu-7 mass % of P-15 mass % of Sn-10 mass % of Ni | 20 | 580° C. | 1 | Close to Ceramic Substrate | Close to Cu foil | AlN | 650° C. | 90 min. | 89.1 |
| Example 1-3 | Cu-7 mass % of P-15 mass % of Sn-10 mass % of Ni | 20 | 580° C. | 2 | Close to Ceramic Substrate | Close to Cu foil | AlN | 650° C. | 90 min. | 97.3 |
| Example 1-4 | Cu-7 mass % of P-15 mass % of Sn-10 mass % of Ni | 20 | 580° C. | 6 | Close to Cu foil | Close to Ceramic Substrate | AlN | 650° C. | 90 min. | 99.7 |
| Example 1-5 | Cu-7 mass % of P-15 mass % of Sn-10 mass % of Ni | 20 | 580° C. | 6 | Close to Ceramic Substrate | Close to Cu foil | AlN | 650° C. | 90 min. | 97.9 |
| Example 1-6 | Cu-7 mass % of P-15 mass % of Sn-10 mass % of Ni | 20 | 580° C. | 10 | Close to Ceramic Substrate | Close to Cu foil | AlN | 650° C. | 90 min. | 98.2 |
| Example 1-7 | Cu-7 mass % of P-15 mass % of Sn-10 mass % of Ni | 20 | 580° C. | 20 | Close to Ceramic Substrate | Close to Cu foil | AlN | 650° C. | 90 min. | 93.2 |
| Example 1-8 | Cu-7 mass % of P-15 mass % of Sn-10 mass % of Ni | 20 | 580° C. | 4 | Close to Ceramic Substrate | Close to Cu foil | AlN | 630° C. | 120 min. | 98.0 |
| Example 1-9 | Cu-7 mass % of P-15 mass % of Sn-10 mass % of Ni | 20 | 580° C. | 4 | Close to Ceramic Substrate | Close to Cu foil | AlN | 600° C. | 150 min. | 97.6 |
| Example 1-10 | Cu-7 mass % of P-15 mass % of Sn-5 mass % of Mn | 20 | 580° C. | 6 | Close to Ceramic Substrate | Close to Cu foil | AlN | 650° C. | 90 min. | 98.2 |
| Example 1-11 | Cu-7 mass % of P-15 mass % of Sn-7 mass % of Cr | 20 | 580° C. | 6 | Close to Ceramic Substrate | Close to Cu foil | AlN | 650° C. | 90 min. | 97.9 |

TABLE 2

| | Cu—P—Sn-based Brazing Filler Material | | | Ti Amount of Ti mg/cm² | Position of Ti Material | Position of Cu—P—Sn-based Brazing Filler Material | Material of Ceramic Substrate | Heating Conditions | | Initial Bonding Rate % |
|---|---|---|---|---|---|---|---|---|---|---|
| | Components | Thickness μm | Melting Point | | | | | Temperature | Time | |
| Example 1-12 | Cu-6.3 mass % of P-9.3 mass % of Sn-7 mass % of Ni | 20 | 600° C. | 5 | Close to Ceramic Substrate | Close to Cu foil | Si₃N₄ | 650° C. | 90 min. | 98.0 |
| Example 1-13 | Cu-7 mass % of P-15 mass % of Sn-10 mass % of Ni | 20 | 580° C. | 6 | Close to Ceramic Substrate | Close to Cu foil | Si₃N₄ | 650° C. | 90 min. | 97.2 |
| Example 1-14 | Cu-7 mass % of P-15 mass % of Sn-10 mass % of Ni | 20 | 580° C. | 6 | Close to Cu foil | Close to Ceramic Substrate | Si₃N₄ | 650° C. | 90 min. | 96.8 |
| Example 1-15 | Cu-7 mass % of P-15 mass % of Sn-10 mass % of Ni | 20 | 580° C. | 3.60 | Close to Cu foil | Close to Ceramic Substrate | AlN | 650° C. | 120 min. | 90.2 |
| Example 1-16 | Cu-7 mass % of P-15 mass % of Sn-10 mass % of Ni | 20 | 580° C. | 2.30 | Close to Cu foil | Close to Ceramic Substrate | AlN | 650° C. | 120 min. | 97.1 |
| Example 1-17 | Cu-7 mass % of P-15 mass % of Sn-10 mass % of Ni | 20 | 580° C. | 0.04 | Close to Cu foil | Close to Ceramic Substrate | AlN | 650° C. | 120 min. | 98.4 |
| Example 1-18 | Cu-7 mass % of P-15 mass % of Sn-10 mass % of Ni | 20 | 580° C. | 0.04 | Close to Ceramic Substrate | Close to Cu foil | AlN | 650° C. | 120 min. | 97.9 |
| Example 1-19 | Cu-7 mass % of P-15 mass % of Sn-10 mass % of Ni | 20 | 580° C. | 0.01 | Close to Cu foil | Close to Ceramic Substrate | AlN | 650° C. | 120 min. | 70.1 |
| Example 1-20 | Cu-7 mass % of P-15 mass % of Sn-10 mass % of Ni | 20 | 580° C. | 0.36 | Close to Cu foil | Close to Ceramic Substrate | Si₃N₄ | 650° C. | 120 min. | 98.0 |
| Comparative Example 1 | Cu-7 mass % of P-15 mass % of Sn-10 mass % of Ni | 20 | 580° C. | — | — | — | AlN | 650° C. | 90 min. | 0.0 |

As shown in Tables 1 and 2, in Examples 1-1 to 1-20 of the present invention, the ceramic substrate and the Cu foil were bonded together with the Cu—P—Sn-based brazing filler material and the Ti material (any of the Ti paste, the Ti foil, and the Ti vapor-deposited film) being interposed therebetween. Therefore, it was confirmed that the initial bonding rate between the ceramic substrate and the circuit layer was high, and the ceramic substrate and the circuit layer were sufficiently bonded to each other.

In contrast, in Comparative Example 1, the ceramic substrate and the Cu foil were bonded to each other without the Ti material being interposed therebetween, and thus the ceramic substrate and the Cu foil (circuit layer) could not be bonded together.

Example 2

Hereinafter, results of confirmation tests (Example 2) performed to confirm the effects of the embodiments of the present invention will be described.

Sheets of Ti material; Cu—P—Sn-based brazing filler material (37 mm×37 mm) with thicknesses shown in Table 3; and Cu foils (37 mm×37 mm×0.3 mm thickness) made of oxygen-free copper were sequentially laminated on first surfaces and second surfaces of ceramic substrates (40 mm×40 mm) shown in Table 3. In each of Examples 2-1 to 2-14 of the present invention, Ti paste was used as the Ti material. The Ti paste was the same paste as Example 1. The Ti paste was applied on the ceramic substrate or the Cu foil using screen-printing so that the amount of Ti provided thereon is set to be the amount shown in Table 3. The Ti paste and the Cu—P—Sn-based brazing filler material were positioned as shown in Table 3. When the material of the ceramic substrate was AlN, the thickness of the ceramic substrate was set to 0.635 mm, and when the material was Si₃N₄, the thickness was set to 0.32 mm. In Example 2-15 of the present invention, Ti foil was used as the Ti material in place of the Ti paste. The thickness of the Ti foil was adjusted so that the amount of Ti therein was set to be the amount shown in Table 3.

While being pressurized at a pressure of 15 kgf/cm² (1.47 MPa) in a laminating direction, the ceramic substrate, the Cu—P—Sn-based brazing filler foil, and the Cu foil, which were laminated on each other, were placed into and heated in a vacuum heating furnace. Thereby, the Cu foils were bonded to the first surface and the second surface of the ceramic substrate, and a circuit layer and a metal layer were formed. The internal pressure of the vacuum heating furnace was set to be in a range of $10^{-6}$ Pa to $10^{-3}$ Pa, and the heating temperature and the heating time were set to the conditions shown in Table 3. As such, the power module substrates in Examples 2-1 to 2-15 of the present invention were obtained.

A power module substrate in Comparative Example 2 was obtained using a method which was the same as that used to obtain the power module substrates in Examples 2-1 to 2-15 except the fact that the ceramic substrate and the circuit layer were bonded to each other without using the Ti material.

In each of the power module substrates obtained in the aforementioned manner, the initial bonding rate between the circuit layer and the ceramic substrate, and the bonding rate after the thermal cycle test were measured. The number of cycles of thermal cycle tests performed until the occurrence of cracking in the ceramic substrate of the power module substrate was measured.

Similar to Example 1, the bonding rate was evaluated. The thermal cycle test was performed as described below.

Results of the aforementioned evaluations were shown in Table 3.

(Thermal Cycle Test)

One cycle of the thermal cycle test was complete by placing the power module substrate in a liquid phase (Fluorinert) at −40° C. for 5 minutes and 150° C. for 5 minutes using a thermal shock tester TSB-51 manufactured by ESPEC. The thermal cycle tests were performed in 2000 cycles. The power module substrate, in which cracking did not occur in the ceramic substrate even after the thermal cycle tests were performed in 2000 cycles, was denoted by ">2000" in Table 3.

TABLE 3

| | Cu—P—Sn-based Brazing Filler Material | | | | | Position of Cu—P—Sn-based Brazing Filler Material | Material of Ceramic Substrate | Heating Conditions | | Initial Bonding Rate % | Bonding Rate After Thermal Cycle % | Cracking in Ceramic Substrate Number of Thermal Cycles |
|---|---|---|---|---|---|---|---|---|---|---|---|---|
| | Components | Thickness μm | Melting Point | Ti Amount mg/cm² | Position of Ti Material | | | Temperature | Time | | | |
| Example 2-1 | Cu-6.3 mass % of P-9.3 mass % of Sn-7 mass % of Ni | 20 | 600° C. | 8 | Close to Ceramic Substrate | Close to Cu foil | AlN | 650° C. | 180 min. | 98.9 | 97.3 | >2000 |
| Example 2-2 | Cu-7 mass % of P-15 mass % of Sn-10 mass % of Ni | 20 | 580° C. | 0.4 | Close to Ceramic Substrate | Close to Cu foil | AlN | 650° C. | 180 min. | 84.2 | 75.3 | >2000 |
| Example 2-3 | Cu-7 mass % of P-15 mass % of Sn-10 mass % of Ni | 20 | 580° C. | 2 | Close to Ceramic Substrate | Close to Cu foil | AlN | 650° C. | 180 min. | 98.7 | 98.4 | >2000 |
| Example 2-4 | Cu-7 mass % of P-15 mass % of Sn-10 mass % of Ni | 20 | 580° C. | 6 | Close to Cu foil | Close to Ceramic Substrate | AlN | 650° C. | 180 min. | 99.4 | 97.2 | >2000 |
| Example 2-5 | Cu-7 mass % of P-15 mass % of Sn-10 mass % of Ni | 20 | 580° C. | 6 | Close to Ceramic Substrate | Close to Cu foil | AlN | 650° C. | 180 min. | 97.9 | 99.6 | >2000 |
| Example 2-6 | Cu-7 mass % of P-15 mass % of Sn-10 mass % of Ni | 20 | 580° C. | 10 | Close to Ceramic Substrate | Close to Cu foil | AlN | 650° C. | 180 min. | 98.2 | 98.2 | >2000 |
| Example 2-7 | Cu-7 mass % of P-15 mass % of Sn-10 mass % of Ni | 20 | 580° C. | 18 | Close to Ceramic Substrate | Close to Cu foil | AlN | 650° C. | 180 min. | 95.1 | 87.2 | 1500-2000 |
| Example 2-8 | Cu-7 mass % of P-15 mass % of Sn-10 mass % of Ni | 20 | 580° C. | 3 | Close to Ceramic Substrate | Close to Cu foil | AlN | 630° C. | 150 min. | 98.0 | 94.3 | >2000 |
| Example 2-9 | Cu-7 mass % of P-15 mass % of Sn-10 mass % of Ni | 20 | 580° C. | 3 | Close to Ceramic Substrate | Close to Cu foil | AlN | 600° C. | 300 min. | 98.6 | 93.8 | >2000 |
| Example 2-10 | Cu-7 mass % of P-15 mass % of Sn-5 mass % of Mn | 20 | 580° C. | 5 | Close to Ceramic Substrate | Close to Cu foil | AlN | 650° C. | 180 min. | 98.1 | 96.4 | >2000 |
| Example 2-11 | Cu-7 mass % of P-15 mass % of Sn-7 mass % of Cr | 20 | 580° C. | 5 | Close to Ceramic Substrate | Close to Cu foil | AlN | 650° C. | 180 min. | 98.4 | 97.9 | >2000 |
| Example 2-12 | Cu-6.3 mass % of P-9.3 mass % of Sn-7 mass % of Ni | 20 | 600° C. | 8 | Close to Ceramic Substrate | Close to Cu foil | Si₃N₄ | 650° C. | 180 min. | 96.7 | 95.3 | >2000 |

TABLE 3-continued

| | Cu—P—Sn-based Brazing Filler Material | | | | | Position of Cu—P—Sn-based Brazing Filler Material | Material of Ceramic Substrate | Heating Conditions | | Initial Bonding Rate % | Bonding Rate After Thermal Cycle % | Cracking in Ceramic Substrate Number of Thermal Cycles |
|---|---|---|---|---|---|---|---|---|---|---|---|---|
| | Components | Thickness μm | Melting Point | Ti Amount mg/cm² | Position of Ti Material | | | Temperature | Time | | | |
| Example 2-13 | Cu-7 mass % of P-15 mass % of Sn-10 mass % of Ni | 20 | 580° C. | 6 | Close to Ceramic Substrate | Close to Cu foil | Si₃N₄ | 650° C. | 180 min. | 97.8 | 96.9 | >2000 |
| Example 2-14 | Cu-7 mass % of P-15 mass % of Sn-10 mass % of Ni | 20 | 580° C. | 6 | Close to Cu foil | Close to Ceramic Substrate | Si₃N₄ | 650° C. | 180 min. | 97.2 | 94.2 | >2000 |
| Example 2-15 | Cu-7 mass % of P-15 mass % of Sn-10 mass % of Ni | 20 | 580° C. | 0.90 | Close to Cu foil | Close to Ceramic Substrate | Si₃N₄ | 650° C. | 180 min. | 96.9 | 93.2 | >2000 |
| Comparative Example 2 | Cu-7 mass % of P-15 mass % of Sn-10 mass % of Ni | 20 | 580° C. | — | — | — | AlN | 650° C. | 180 min. | 0.0 | — | — |

As shown in Table 3, in Examples 2-1 to 2-15 of the present invention, the ceramic substrate and the Cu foil were bonded to each other with the Cu—P—Sn-based brazing filler material and the Ti material (the Ti paste or the Ti foil) being interposed therebetween, and thus it was confirmed that the initial bonding rate between the ceramic substrate and the circuit layer was high, and the ceramic substrate and the circuit layer were sufficiently bonded together. In Examples 2-1 to 2-15 of the present invention, it was confirmed that the bonding rate after the thermal cycle test was high, and the reliability of bonding was high. In Examples 2-1 to 2-15 of the present invention, it was confirmed that the number of cycles of thermal cycle tests, which were performed until the occurrence of cracking in the ceramic substrate, was large, and cracking was unlikely to occur in the ceramic substrate.

In contrast, in Comparative Example 2, the ceramic substrate and the Cu foil were bonded to each other without the Ti material being interposed therebetween, and thus the ceramic substrate and the Cu foil (circuit layer) could not be bonded to each other.

Example 3

Hereinafter, results of confirmation tests (Example 3) performed to confirm the effects of the embodiments of the present invention will be described.

Sheets of Ti material: Cu—P—Sn-based brazing filler material (37 mm×37 mm) with thicknesses shown in Table 4; and Cu foils (37 mm×37 mm×0.3 mm thickness) made of oxygen-free copper were sequentially laminated on first surfaces of ceramic substrates (40 mm×40 mm) shown in Table 4. Al plates (37 mm×37 mm×1.6 mm thickness) made of Al with a purity of 99.99 mass % was laminated on second surfaces of the ceramic substrates with the Al—Si-based brazing filler material interposed therebetween. In each of Examples 3-1 to 3-14 of the present invention, Ti paste was used as the Ti material. The Ti paste was the same paste as Example 1. The Ti paste was applied on the ceramic substrate or the Cu foil using screen-printing so that the amount of Ti provided thereon is set to be the amount shown in Table 4. The Ti paste and the Cu—P—Sn-based brazing filler material were positioned as shown in Table 4. When the material of the ceramic substrate was AlN, the thickness of the ceramic substrate was set to 0.635 mm, and when the material was Si₃N₄, the thickness was set to 0.32 mm. In Example 3-15 of the present invention, Ti vapor-deposited film was used in place of the Ti paste. The thickness of the Ti vapor-deposited film was adjusted so that the amount of Ti therein was set to be the amount shown in Table 4.

While being pressurized at a pressure of 15 kgf/cm² (1.47 MPa) in a laminating direction, the ceramic substrate, the Ti paste (or Ti vapor-deposited film), the Cu—P—Sn-based brazing filler material, the Cu foil, the Al—Si-based brazing filler material, and the Al plate, which were laminated on each other, were placed into and heated in a vacuum heating furnace. Thereby, the Cu foil was bonded to the first surface of the ceramic substrate and a circuit layer was formed, while the Al plate was bonded to the second surface of the ceramic substrate and a metal layer was formed. The internal pressure of the vacuum heating furnace was set to be in a range of $10^{-6}$ Pa to $10^{-3}$ Pa, and the heating temperature and the heating time were set to the conditions shown in Table 4. As such, the power module substrates in Examples 3-1 to 3-15 of the present invention were obtained.

A power module substrate in Comparative Example 3 was obtained using a method which was the same as that used to obtain the power module substrates in Examples 3-1 to 3-15 except the fact that the ceramic substrate and the circuit layer were bonded to each other without using the Ti material.

The following was measured for each of the power module substrates obtained in the aforementioned manner: the initial bonding rate between the circuit layer and the ceramic substrate; the bonding rate after the thermal cycle test; and the number of cycles of thermal cycle tests performed until the occurrence of cracking in the ceramic substrate of the power module substrate.

Similar to Example 2, the bonding rate was evaluated, and the thermal cycle test was performed.

Results of the aforementioned evaluations are shown in Table 4.

TABLE 4

| | Cu—P—Sn-based Brazing Filler Material | | | Ti Amount of Ti mg/cm² | Position of Ti Material | Position of Cu—P—Sn-based Brazing Filler Material | Material of Ceramic Substrate | Heating Conditions | | Initial Bonding Rate % | Bonding Rate After Thermal Cycle % | Cracking in Ceramic Substrate Number of Thermal Cycles |
| | Components | Thickness μm | Melting Point | | | | | Temperature | Time | | | |
|---|---|---|---|---|---|---|---|---|---|---|---|---|
| Example 3-1 | Cu-6.3 mass % of P-9.3 mass % of Sn-7 mass % of Ni | 20 | 600° C. | 6 | Close to Ceramic Substrate | Close to Cu foil | AlN | 650° C. | 210 min. | 98.1 | 96.5 | >2000 |
| Example 3-2 | Cu-7 mass % of P-15 mass % of Sn-10 mass % of Ni | 20 | 580° C. | 0.5 | Close to Ceramic Substrate | Close to Cu foil | AlN | 650° C. | 210 min. | 85.1 | 79.3 | >2000 |
| Example 3-3 | Cu-7 mass % of P-15 mass % of Sn-10 mass % of Ni | 20 | 580° C. | 2 | Close to Ceramic Substrate | Close to Cu foil | AlN | 650° C. | 210 min. | 97.9 | 97.1 | >2000 |
| Example 3-4 | Cu-7 mass % of P-15 mass % of Sn-10 mass % of Ni | 20 | 580° C. | 6 | Close to Cu foil | Close to Ceramic Substrate | AlN | 650° C. | 210 min. | 99.5 | 98.5 | >2000 |
| Example 3-5 | Cu-7 mass % of P-15 mass % of Sn-10 mass % of Ni | 20 | 580° C. | 6 | Close to Ceramic Substrate | Close to Cu foil | AlN | 650° C. | 210 min. | 98.7 | 97.5 | >2000 |
| Example 3-6 | Cu-7 mass % of P-15 mass % of Sn-10 mass % of Ni | 20 | 580° C. | 10 | Close to Ceramic Substrate | Close to Cu foil | AlN | 650° C. | 210 min. | 98.3 | 97.2 | >2000 |
| Example 3-7 | Cu-7 mass % of P-15 mass % of Sn-10 mass % of Ni | 20 | 580° C. | 17 | Close to Ceramic Substrate | Close to Cu foil | AlN | 650° C. | 210 min. | 94.2 | 89.7 | 1500-2000 |
| Example 3-8 | Cu-7 mass % of P-15 mass % of Sn-10 mass % of Ni | 20 | 580° C. | 5 | Close to Ceramic Substrate | Close to Cu foil | AlN | 630° C. | 60 min. | 98.0 | 94.2 | >2000 |
| Example 3-9 | Cu-7 mass % of P-15 mass % of Sn-10 mass % of Ni | 20 | 580° C. | 5 | Close to Ceramic Substrate | Close to Cu foil | AlN | 600° C. | 360 min. | 97.8 | 93.1 | >2000 |
| Example 3-10 | Cu-7 mass % of P-15 mass % of Sn-5 mass % of Mn | 20 | 580° C. | 7 | Close to Ceramic Substrate | Close to Cu foil | AlN | 650° C. | 210 min. | 98.4 | 96.4 | >2000 |
| Example 3-11 | Cu-7 mass % of P-15 mass % of Sn-7 mass % of Cr | 20 | 580° C. | 7 | Close to Ceramic Substrate | Close to Cu foil | AlN | 650° C. | 210 min. | 97.7 | 95.8 | >2000 |
| Example 3-12 | Cu-6.3 mass % of P-9.3 mass % of Sn-7 mass % of Ni | 20 | 600° C. | 6 | Close to Ceramic Substrate | Close to Cu foil | $Si_3N_4$ | 650° C. | 210 min. | 97.2 | 96.3 | >2000 |
| Example 3-13 | Cu-7 mass % of P-15 mass % of Sn-10 mass % of Ni | 20 | 580° C. | 2 | Close to Ceramic Substrate | Close to Cu foil | $Si_3N_4$ | 650° C. | 210 min. | 97.0 | 96.1 | >2000 |
| Example 3-14 | Cu-7 mass % of P-15 mass % of Sn-10 mass % of Ni | 20 | 580° C. | 6 | Close to Cu foil | Close to Ceramic Substrate | $Si_3N_4$ | 650° C. | 210 min. | 98.6 | 96.6 | >2000 |
| Example 3-15 | Cu-7 mass % of P-15 mass % of Sn-10 mass % of Ni | 20 | 580° C. | 0.68 | Close to Cu foil | Close to Ceramic Substrate | $Si_3N_4$ | 650° C. | 210 min. | 97.9 | 93.8 | >2000 |
| Comparative Example 3 | Cu-7 mass % of P-15 mass % of Sn-10 mass % of Ni | 20 | 580° C. | — | — | — | AlN | 650° C. | 210 min. | 0.0 | — | — |

As shown in Table 4, in Examples 3-1 to 3-15 of the present invention, the ceramic substrate and the Cu foil were bonded to each other with the Cu—P—Sn-based brazing filler material and the Ti material (the Ti paste or the Ti vapor-deposited film) being interposed therebetween, and thus it was confirmed that the initial bonding rate between the ceramic substrate and the circuit layer was high, and the ceramic substrate and the circuit layer were sufficiently bonded to each other. In Examples 3-1 to 3-15 of the present invention, it was confirmed that the bonding rate after the thermal cycle test was high, and the reliability of bonding was high. In Examples 3-1 to 3-15 of the present invention, it was confirmed that the number of cycles of thermal cycle tests, which were performed until the occurrence of cracking in the ceramic substrate, was large, and cracking was unlikely to occur in the ceramic substrate.

In contrast, in Comparative Example 3, the ceramic substrate and the Cu foil were bonded to each other without the Ti material being interposed therebetween, and thus the ceramic substrate and the Cu foil (circuit layer) could not be bonded to each other.

Example 4

Hereinafter, results of confirmation tests (Example 4) performed to confirm the effects of the embodiments of the present invention will be described.

Similar to Example 1, Cu foils made of oxygen-free copper were bonded to the ceramic substrates shown in Table 5, and then the bonding rates thereof were evaluated.

In Example 4, Ti paste containing $TiH_2$ powder shown in Table 5, acrylic resin (as resin), α-terpineol (as solvent), and anion surface-acting agent (as dispersant), was used. Mass fraction of organic elements (including the resin, the solvent, and the dispersant), that is, the fraction of the mass of the resin:the solvent:the dispersant in the Ti paste was set to be 82.5:15:2.5.

The amount of $TiH_2$ was adjusted as shown in Table 5 by adjusting the amount of $TiH_2$ powder contained in the Ti paste and the coating amount of Ti paste.

Subsequently, the ceramic substrates and the Cu foils were bonded to each other under the same condition as that of Example 1. Cu—P—Sn-based brazing filler material shown in Table 5 was used. The heating temperature and the heating time were set to the conditions shown in Table 5.

In each of the power module substrates obtained in the aforementioned manner, the initial bonding rate between the circuit layer (Cu foil) and the ceramic substrate was evaluated similar to Example 1. Results of the evaluations are shown in Table 5.

TABLE 5

| | Cu—P—Sn-based Brazing Filler Material | | | Particle | | | Position of Cu—P—Sn-based | Material of | Heating | | Initial Bonding |
|---|---|---|---|---|---|---|---|---|---|---|---|
| | Components | Thickness μm | Melting Point | Diameter of $TiH_2$ μm | Amount of $TiH_2$ mg/cm² | Position of Ti Material | Brazing Filler Material | Ceramic Substrate | Temperature | Time | Rate % |
| Example 4-1 | Cu-6.3 mass % of P-9.3 mass % of Sn-7 mass % of Ni | 20 | 600° C. | 10 | 3.00 | Close to Cu foil | Close to Ceramic Substrate | AlN | 630° C. | 90 min. | 97.2 |
| Example 4-2 | Cu-7 mass % of P-15 mass % of Sn-10 mass % of Ni | 20 | 580° C. | 5 | 3.00 | Close to Cu foil | Close to Ceramic Substrate | AlN | 650° C. | 120 min. | 98.4 |
| Example 4-3 | Cu-7 mass % of P-15 mass % of Sn-10 mass % of Ni | 20 | 580° C. | 15 | 5.00 | Close to Cu foil | Close to Ceramic Substrate | AlN | 650° C. | 120 min. | 98.3 |
| Example 4-4 | Cu-7 mass % of P-15 mass % of Sn-10 mass % of Ni | 20 | 580° C. | 5 | 12.00 | Close to Cu foil | Close to Ceramic Substrate | AlN | 650° C. | 60 min. | 90.1 |
| Example 4-5 | Cu-7 mass % of P-15 mass % of Sn-10 mass % of Ni | 20 | 580° C. | 5 | 8.00 | Close to Cu foil | Close to Ceramic Substrate | AlN | 650° C. | 60 min. | 97.9 |
| Example 4-6 | Cu-7 mass % of P-15 mass % of Sn-10 mass % of Ni | 20 | 580° C. | 5 | 0.04 | Close to Cu foil | Close to Ceramic Substrate | AlN | 650° C. | 60 min. | 97.1 |
| Example 4-7 | Cu-7 mass % of P-15 mass % of Sn-10 mass % of Ni | 20 | 580° C. | 5 | 0.01 | Close to Cu foil | Close to Ceramic Substrate | AlN | 650° C. | 60 min. | 68.3 |
| Example 4-8 | Cu-7 mass % of P-15 mass % of Sn-10 mass % of Ni | 20 | 580° C. | 5 | 0.20 | Close to Cu foil | Close to Ceramic Substrate | AlN | 650° C. | 30 min. | 97.7 |
| Example 4-9 | Cu-7 mass % of P-15 mass % of Sn-10 mass % of Ni | 20 | 580° C. | 5 | 0.20 | Close to Cu foil | Close to Ceramic Substrate | AlN | 600° C. | 240 min. | 93.0 |

TABLE 5-continued

| | Cu—P—Sn-based Brazing Filler Material | | | Particle Diameter of TiH$_2$ μm | TiH$_2$ Amount mg/cm$^2$ | Position of Ti Material | Position of Cu—P—Sn-based Brazing Filler Material | Material of Ceramic Substrate | Heating Conditions | | Initial Bonding Rate % |
|---|---|---|---|---|---|---|---|---|---|---|---|
| | Components | Thickness μm | Melting Point | | | | | | Temperature | Time | |
| Example 4-10 | Cu-7 mass % of P-15 mass % of Sn-10 mass % of Ni | 20 | 580° C. | 5 | 0.20 | Close to Ceramic Substrate | Close to Cu foil | AlN | 630° C. | 60 min. | 96.7 |
| Example 4-11 | Cu-7 mass % of P-15 mass % of Sn-10 mass % of Ni | 20 | 580° C. | 5 | 0.20 | Close to Cu foil | Close to Ceramic Substrate | Si$_3$N$_4$ | 650° C. | 30 min. | 96.9 |

As shown in Table 5, in Examples 4-1 to 4-11 of the present invention in which the TiH$_2$ powder was used as the Ti paste, it was confirmed that the initial bonding rate between the ceramic substrate and the circuit layer (the Cu foil) was high, and the ceramic substrate and the circuit layer were sufficiently bonded to each other.

INDUSTRIAL APPLICABILITY

In the bonded body and the power module substrate of the present invention, the ceramic member and the Cu member can be sufficiently bonded to each other, and when the bonded body and the power module substrate undergo a thermal cycle, the occurrence of cracking in the ceramic member can be limited. For this reason, the bonded body and the power module substrate of the present invention are suitably used in a power module under severe operating environments, for example, a high-power control power semiconductor element used to control wind power generation systems and electric vehicles such as electric automobiles.

REFERENCE SIGNS LIST 10, 110, 210, 310: POWER MODULE SUBSTRATE (BONDED BODY)
11: CERAMIC SUBSTRATE (CERAMIC MEMBER)
12, 112, 212, 312: CIRCUIT LAYER (Cu MEMBER)
113, 213: METAL LAYER (Cu MEMBER)
14: Cu—Sn LAYER
17, 317: INTERMETALLIC COMPOUND
22, 122, 123, 222, 322: Cu FOIL (Cu MEMBER)

The invention claimed is:

1. A bonded body comprising:
  a ceramic member made of ceramics; and
  a Cu member which is made of Cu or a Cu alloy and bonded to the ceramic member through a Cu—P—Sn-based brazing filler material and a Ti material,
  wherein a Cu—Sn layer, in which Sn forms a solid solution with Cu, is formed at a bonded interface between the ceramic member and the Cu member, and intermetallic compounds containing P and Ti are dispersed in the Cu—Sn layer.

2. A power module substrate comprising the bonded body according to claim 1, wherein the substrate further comprises:
  a ceramic substrate formed of the ceramic member; and
  a circuit layer formed by bonding a Cu foil formed of the Cu member to a first surface of the ceramic substrate through the Cu—P—Sn-based brazing filler material and the Ti material,
  wherein the Cu—Sn layer, in which Sn forms a solid solution with Cu, is formed at a bonded interface between the ceramic substrate and the circuit layer, and the intermetallic compounds containing P and Ti are dispersed in the Cu—Sn layer.

3. The power module substrate according to claim 2, wherein a metal layer is formed on a second surface of the ceramic substrate.

4. The power module substrate according to claim 3, wherein the metal layer is formed by bonding a Cu foil made of Cu or a Cu alloy to the second surface of the ceramic substrate through a Cu—P—Sn-based brazing filler material and a Ti material,
  a Cu—Sn layer, in which Sn forms a solid solution with Cu, is formed at a bonded interface between the ceramic substrate and the metal layer, and intermetallic compounds containing P and Ti are dispersed in the Cu—Sn layer.

5. The power module substrate according to claim 3, wherein the metal layer is made of Al or an Al alloy.

* * * * *